US008497025B2

(12) United States Patent
Uera et al.

(10) Patent No.: US 8,497,025 B2
(45) Date of Patent: Jul. 30, 2013

(54) POLYIMIDE, POLYAMIC ACID AND PROCESSES FOR THE PRODUCTION THEREOF

(75) Inventors: Kazuyoshi Uera, Tokyo (JP); Daisuke Ohno, Tokyo (JP); Kenji Ishii, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 530 days.

(21) Appl. No.: 12/453,511

(22) Filed: May 13, 2009

(65) Prior Publication Data

US 2009/0286094 A1  Nov. 19, 2009

(30) Foreign Application Priority Data

May 14, 2008 (JP) ................................ 2008-127210

(51) Int. Cl.
*C08G 73/14* (2006.01)
*C08G 63/06* (2006.01)
(52) U.S. Cl.
USPC ............................ 428/458; 528/170; 528/208
(58) Field of Classification Search
USPC .................................... 428/458; 528/170, 208
See application file for complete search history.

(56) References Cited

U.S. PATENT DOCUMENTS

| 3,257,357 | A | * | 6/1966 | Stamatoff | 528/215 |
|---|---|---|---|---|---|
| 4,271,288 | A | * | 6/1981 | Woo | 528/353 |
| 4,431,779 | A | * | 2/1984 | White et al. | 525/397 |
| 4,851,544 | A | * | 7/1989 | Ottenbrite | 548/524 |
| 4,895,915 | A | * | 1/1990 | Ottenbrite | 526/262 |
| 4,931,531 | A | | 6/1990 | Tamai et al. | |
| 5,011,905 | A | * | 4/1991 | Lubowitz et al. | 528/170 |
| 5,116,935 | A | * | 5/1992 | Lubowitz et al. | 528/173 |
| 5,175,234 | A | * | 12/1992 | Lubowitz et al. | 528/173 |
| 5,278,276 | A | | 1/1994 | Ohta et al. | |
| 5,344,894 | A | * | 9/1994 | Lubowitz et al. | 525/422 |
| 7,193,030 | B2 | * | 3/2007 | Ohno et al. | 528/335 |
| 2004/0258852 | A1 | * | 12/2004 | Ohno et al. | 428/1.26 |

OTHER PUBLICATIONS

European Search Report issued Sep. 20, 2011, in corresponding European Application No. 09251313.4.
Yasufumi Watanabe et al., "Synthesis and characterization of polyimides with low dielectric constants from aromatic dianhydrides and aromatic diamine containing phenylene ether unit", Polymer, Jul. 25, 2005, vol. 46, No. 16, pp. 5903-5908.

* cited by examiner

*Primary Examiner* — James J Seidleck
*Assistant Examiner* — Peter A Salamon
(74) *Attorney, Agent, or Firm* — Wenderoth, Lind & Ponack, L.L.P.

(57) ABSTRACT

A novel polyimide as a high molecular weight material having a low dielectric constant, a low dielectric loss tangent and low water absorptivity, a polyamic acid capable of generating the above polyimide, the above polyimide and the polyamic acid being obtained by reacting an aromatic diamine, obtained by introducing aromatic amino groups into both terminals of a specific bifunctional phenylene ether oligomer, with an acid anhydride, a process for the production of the polyimide, a process for the production of the polyimide, a film of the polyimide, and a laminate comprising the above film.

11 Claims, No Drawings

POLYIMIDE, POLYAMIC ACID AND PROCESSES FOR THE PRODUCTION THEREOF

FIELD OF THE INVENTION

The present invention relates to a polyamic acid obtained by reacting an aromatic diamine obtained from a bifunctional phenylene ether oligomer having a specific structure, as a raw material, with an acid dianhydride, a polyimide and process for the production thereof.

BACKGROUND OF THE INVENTION

Conventionally, a polyimide has been widely used in the fields of molding materials, composite materials, electrical and electronic parts since a polyimide has excellent heat resistance and also has excellent properties in terms of mechanical physical properties, chemical resistance, flame retardancy and electrical characteristics. Recently, developments of microelectronics technologies are remarkable in the field of electrical and electronic parts. In particular, large computers employ a multilayer circuit board so that high-speed signal transmission is necessary to the large computers. However, when the dielectric constant of a board material is large, a delay in signal transmission occurs, which hinders speed-up. A polyimide is used for an interlayer insulation film of a multilayer wiring structure. However, from these reasons, a decrease in dielectric constant is further required of a polyimide in addition to its conventional excellent insulation properties.

On the other hand, in order to secure insulation reliability and dimensional stability, which are essential for high-density packaging accompanied by the recent progress of electronic materials, a resin for electronic materials is required to exhibit low dielectric characteristics even in high-humidity environment. However, generally, the dielectric characteristics of a polyimide at a moisture-absorbed time largely differ from those at a dried time since an imide group is apt to absorb moisture. This is a problem with regard to the employment of a polyimide as electronic materials.

A variety of polyimides and polyamic acids, which are raw materials for polyimides, have been proposed for solving these problems (for instance, JP-A-10-152559). However, these proposals are not sufficient for coping with the recent demand for further high-performance in the electronic material field.

SUMMARY OF THE INVENTION

It is an object of the present invention to provide a polyimide useful as a high molecular weight material having a low dielectric constant, a low dielectric loss tangent and low water absorptivity and a polyamic acid which is capable of generating the above polyimide.

The present inventors have developed bifunctional phenylene ether oligomers, which have the excellent low dielectric characteristics and heat resistance of a polyphenylene ether structure and also have specific structures, and their derivatives. The present inventors have made further diligent studies and as a result found that a terminal aromatic diamine can be derived from a bifunctional phenylene ether oligomer through a terminal aromatic dinitro compound and that a polyimide obtained from the above terminal aromatic diamine and an acid dianhydride has low dielectric characteristics and can maintain the low dielectric characteristics even after moisture absorption. On the basis of the above findings, the present inventors have completed the present invention.

The present invention is directed to a polyimide having a structural unit of the formula (1), a film made of the above polyimide and a laminate comprising the above film and a metal layer on one side or both sides of the above film,

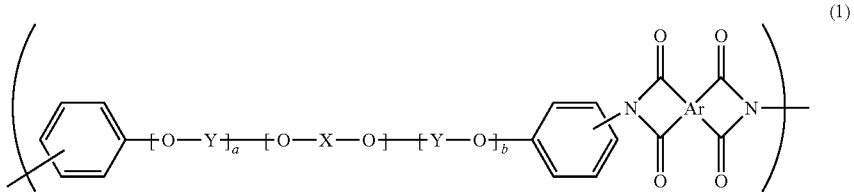

(1)

wherein —(O—X—O)— is a structure of the formula (2) or the formula (3), —(Y—O)— is an arrangement of one kind of structure of the formula (4) or a random arrangement of at least two kinds of structures of the formula (4), each of a and b is an integer of 0 to 100, provided that at least one of a and b is not 0, and Ar represents a tetravalent aromatic group selected from the group consisting of a monocyclic aromatic group, a condensed polycyclic aromatic group and a non-condensed polycyclic aromatic group having a structure in which monocyclic aromatic groups are connected to each other directly or through a connecting group,

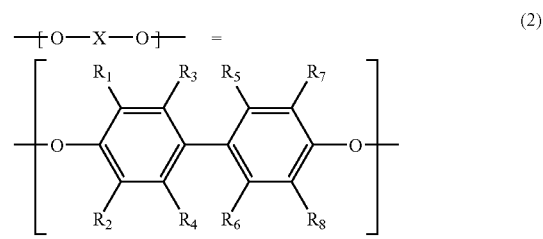

(2)

wherein $R_1$, $R_2$, $R_3$, $R_7$ and $R_8$ are the same or different and represent an alkyl group having 6 or less carbon atoms or a phenyl group and $R_4$, $R_5$ and $R_6$ are the same or different and represent a hydrogen atom, an alkyl group having 6 or less carbon atoms or a phenyl group,

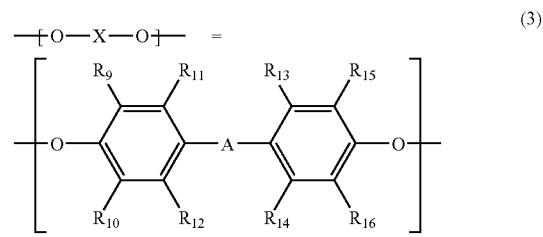

(3)

wherein $R_9$, $R_{10}$, $R_{11}$, $R_{12}$, $R_{13}$, $R_{14}$, $R_{15}$ and $R_{16}$ are the same or different and represent a hydrogen atom, an alkyl group having 6 or less carbon atoms or a phenyl group and -A- represents a linear, branched or cyclic bivalent hydrocarbon group having 20 or less carbon atoms,

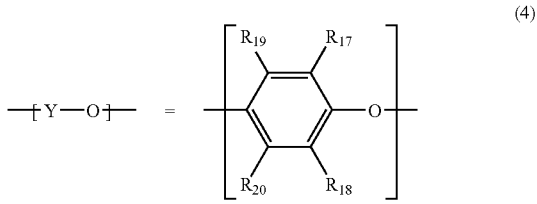

(4)

wherein $R_{17}$ and $R_{18}$ are the same or different and represent an alkyl group having 6 or less carbon atoms or a phenyl group and $R_{19}$ and $R_{20}$ are the same or different and represent a hydrogen atom, an alkyl group having 6 or less carbon atoms or a phenyl group.

The present invention is further directed to a polyamic acid having a structural unit of the formula (18),

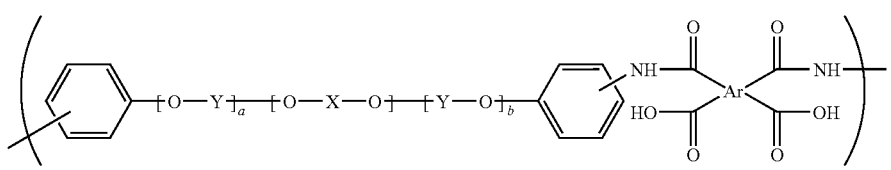

(18)

wherein —(O—X—O)— is a structure of the formula (2) or the formula (3), —(Y—O)— is an arrangement of one kind of structure of the formula (4) or a random arrangement of at least two kinds of structures of the formula (4), each of a and b is an integer of 0 to 100, provided that at least one of a and b is not 0, and Ar represents a tetravalent aromatic group selected from the group consisting of a monocyclic aromatic group, a condensed polycyclic aromatic group and a non-condensed polycyclic aromatic group having a structure in which monocyclic aromatic groups are connected to each other directly or through a connecting group.

EFFECT OF THE INVENTION

The polyimide of the present invention has low water absorptivity so that the polyimide shows only a little change in terms of dielectric characteristics under high humidity. Therefore, the polyimide of the present invention is usable for wide applications such as a resin for a copper-clad laminate, a resin for a resist, a resin for sealing electronic parts, a resin for a color filter of a liquid crystal, a coating, a variety of coating agents, an adhesive, a buildup laminate material, a resin for a flexible substrate and a functional film. Further, the polyamic acid of the present invention is capable of easily generating a polyimide excellent in low dielectric characteristics and low water absorptivity.

DETAILED DESCRIPTION OF THE INVENTION

The present invention will be explained in detail, hereinafter. First, in the polyimide having a structural unit represented by the formula (1), —(O—X—O)— represents a structure defined by the formula (2) or the formula (3), —(Y—O)— represents an arrangement of one kind of structure defined by the formula (4) or a random arrangement of at least two kinds of structures defined by the formula (4), Ar represents a tetravalent aromatic group selected from the group consisting of a monocyclic aromatic group, a condensed polycyclic aromatic group and a non-condensed polycyclic aromatic group having a structure in which monocyclic aromatic groups are connected to each other directly or through a connecting group, and each of a and b is an integer of 0 to 100, provided that at least one of a and b is not 0. In the formula (2), $R_1$, $R_2$, $R_3$, $R_7$ and $R_8$ are the same or different and represent an alkyl group having 6 or less carbon atoms or a phenyl group and $R_4$, $R_5$ and $R_6$ are the same or different and represent a hydrogen atom, an alkyl group having 6 or less carbon atoms or a phenyl group. In the formula (3), $R_9$, $R_{10}$, $R_{11}$, $R_{12}$, $R_{13}$, $R_{14}$, $R_{15}$ and $R_{16}$ are the same or different and represent a hydrogen atom, an alkyl group having 6 or less carbon atoms or a phenyl group and -A- represents a linear, branched or cyclic bivalent hydrocarbon group having 20 or less carbon atoms. In the formula (4), $R_{17}$ and $R_{18}$ are the same or different and represent an alkyl group having 6 or less carbon atoms or a phenyl group and $R_{19}$ and $R_{20}$ are the same or different and represent a hydrogen atom, an alkyl group having 6 or less carbon atoms or a phenyl group.

In particular, preferred are a polyimide having a structural unit of the formula (1) wherein $R_1$, $R_2$, $R_3$, $R_7$ and $R_8$ in the formula (2) represent an alkyl group having 3 or less carbon atoms and $R_4$, $R_5$ and $R_6$ in the formula (2) represent a hydrogen atom or an alkyl group having 3 or less carbon atoms, a polyimide having a structural unit of the formula (1) wherein $R_9$, $R_{10}$, $R_{11}$, $R_{12}$, $R_{13}$, $R_{14}$, $R_{15}$ and $R_{16}$ in the formula (3) represent a hydrogen atom or an alkyl group having 3 or less carbon atoms and a polyimide having a structural unit of the formula (1) wherein $R_{17}$ and $R_{18}$ in the formula (4) represent an alkyl group having 3 or less carbon atoms and $R_{19}$ and $R_{20}$ in the formula (4) represent a hydrogen atom or an alkyl group having 3 or less carbon atoms.

Especially preferred is a polyimide having a structural unit of the formula (1) wherein —(O—X—O)— represented by the formula (2) is represented by the formula (6) or —(O—X—O)— represented by the formula (3) is represented by the formula (7) or the formula (8) and —(Y—O)— represented by the formula (4) is an arrangement of a structure of the formula (9) or the formula (10) or a random arrangement of a structure of the formula (9) and a structure of the formula (10).

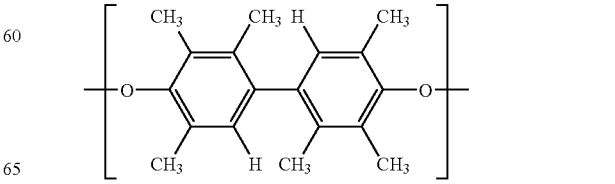

(6)

-continued

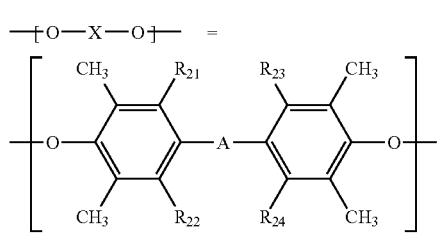

(7)

wherein $R_{21}$, $R_{22}$, $R_{23}$ and $R_{24}$ are the same or different and represent a hydrogen atom or a methyl group and -A- represents a linear, branched or cyclic bivalent hydrocarbon group having 20 or less carbon atoms.

(8)

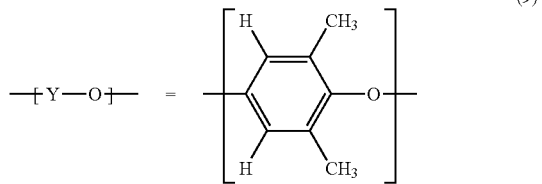

wherein -A- represents a linear, branched or cyclic bivalent hydrocarbon group having 20 or less carbon atoms.

(9)

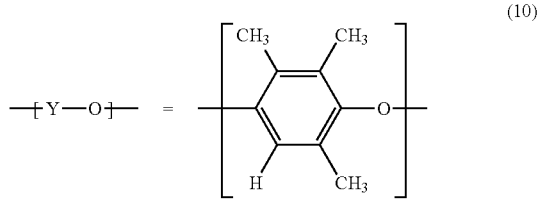

(10)

Examples of Ar in the formula (1) include tetravalent aromatic groups having molecular structures such as molecular structures of benzene, biphenyl, naphthalene, benzophenone, 2,2-diphenylpropane, 2,2-diphenyl-1,1,1,3,3,3-hexafluoropropane, diphenyl ether, diphenyl sulfone, 9,9-diphenylfluorene and perylene. Ar is not limited to these.

Further, Ar in the formula (1) can be a tetravalent non-condensed polycyclic aromatic group in which monocyclic aromatic groups such as benzene or biphenyl are connected to each other through a connecting group such as an oxygen atom, a carbonyl group, an ester group, methylene, ethylidene, 1-methylethylidene, 1,1-propylidene, 1,4-phenylenebis(1-methylethylidene), 1,3-phenylenebis(1-methylethylidene), cyclohexylidene, phenylmethylene, naphthylmethylene or 1-phenylethylidene. The aromatic group used for Ar can have a substituent such as a methyl group or an ethyl group.

Of these, a tetravalent aromatic group having 6 to 30 carbon atoms or a tetravalent aromatic group represented by the formula (11) is preferred as Ar. Further preferably, the structural unit of the formula (1) is a structural unit represented by the formula (15), the formula (16) or the formula (17).

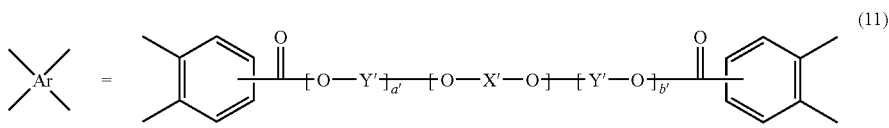

(11)

wherein —(O—X'—O)— is a structure defined by the formula (12) or the formula (13), —(Y'—O)— is an arrangement of one kind of structure defined by the formula (14) or a random arrangement of at least two kinds of structures defined by the formula (14) and each of a' and b' is an integer of 0 to 100, provided that at least one of a' and b' is not 0.

(12)

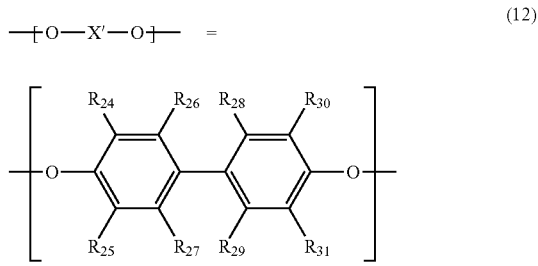

wherein $R_{24}$, $R_{25}$, $R_{26}$, $R_{30}$ and $R_{31}$ are the same or different and represent an alkyl group having 6 or less carbon atoms or a phenyl group and $R_{27}$, $R_{28}$ and $R_{29}$ are the same or different and represent a hydrogen atom, an alkyl group having 6 or less carbon atoms or a phenyl group.

(13)

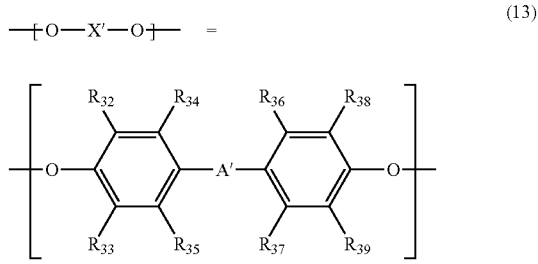

wherein $R_{32}$, $R_{33}$, $R_{34}$, $R_{35}$, $R_{36}$, $R_{37}$, $R_{38}$ and $R_{39}$ are the same or different and represent a hydrogen atom, an alkyl group having 6 or less carbon atoms or a phenyl group and -A'- represents a linear, branched or cyclic bivalent hydrocarbon group having 20 or less carbon atoms.

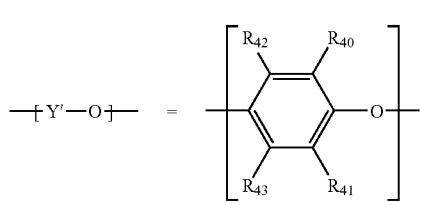

(14)

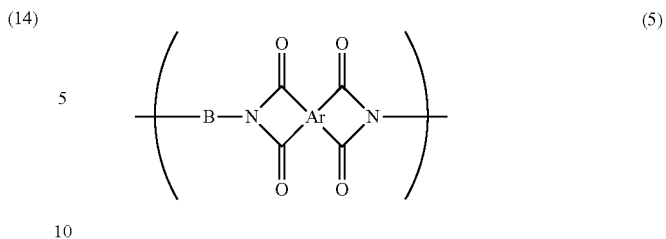

(5)

wherein $R_{40}$ an $R_{41}$ are the same or different and represent an alkyl group having 6 or less carbon atoms or a phenyl group and $R_{42}$ and $R_{43}$ are the same or different and represent a hydrogen atom, an alkyl group having 6 or less carbon atoms or a phenyl group.

wherein Ar represents a tetravalent aromatic group selected from the group consisting of a monocyclic aromatic group, a condensed polycyclic aromatic group and a non-condensed polycyclic aromatic group having a structure in which monocyclic aromatic groups are connected to each other directly or

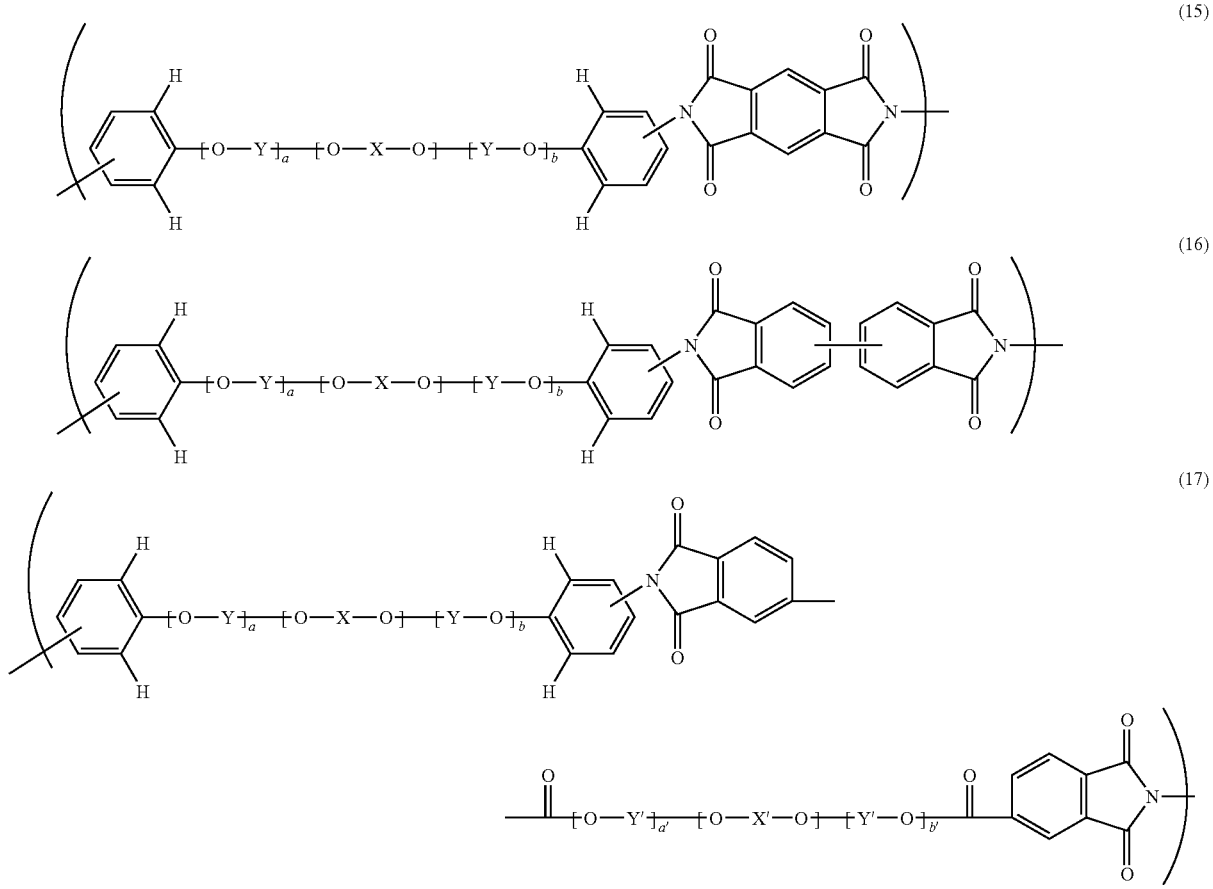

wherein —(O—X'—O)— is a structure defined by the formula (12) or the formula (13), —(Y'—O)— is an arrangement of one kind of structure defined by the formula (14) or a random arrangement of at least two kinds of structures defined by the formula (14) and each of a' and b' is an integer of 0 to 100, provided that at least one of a' and b' is not 0.

Examples of -A- in the formula (3) include bivalent organic groups such as methylene, ethylidene, 1-methylethylidene, 1,1-propylidene, 1,4-phenylenebis(1-methylethylidene), 1,3-phenylenebis(1-methylethylidene), cyclohexylidene, phenylmethylene, naphthylmethylene and 1-phenylethylidene. -A- is not limited to these examples.

The polyimide of the present invention can further contain a structural unit represented by the formula (5) in a formula (1):formula (5) ratio of 100:0-50:50.

through a connecting group and B represents a bivalent aromatic group having 6 to 30 carbon atoms which is selected from the group consisting of a monocyclic aromatic group, a condensed polycyclic aromatic group and a non-condensed polycyclic aromatic group having a structure in which monocyclic aromatic groups are connected to each other directly or through a connecting group.

Examples of B, which represents a bivalent aromatic groups having 6 to 30 carbon atoms, include monocyclic aromatic groups such as 1,3-phenylene, 1,4-phenylene, 4,4'-biphenylene, 5-chloro-1,3-phenylene and 5-methoxy-1,3-phenylene; condensed polycyclic aromatic groups such as 1,4-naphthylene, 2,6-naphthylene, 1,4-anthrylene, 9,10-anthrylene and 3,4-perylenylene; and bivalent non-condensed polycyclic aromatic groups having a structure in which monocyclic aromatic groups, typified by phenyl or biphenyl, are connected to each other through a connecting group, such as 2,2-propylidenebis(1,4-phenylene), 2,2-(1,1,1,3,3,3-hexafluoropropylidene)bis(1,4-phenylene), carbonylbis(1,4-phenylene), oxybis(1,4-phenylene), sulfonylbis(1,4-phenylene) and 9,9-fluorenylidenebis(1,4-phenylene). Examples of the above connecting group include an oxygen atom, a carbonyl group, an ester group, methylene, ethylidene, 1-methylethylidene, 1,1-propylidene, 1,4-phenylenebis(1-methylethylidene), 1,3-phenylenebis(1-methylethylidene), cyclohexylidene, phenylmethylene, naphthylmethylene or 1-phenylethylidene. B is not limited to these examples. Further, the aromatic group used for B can have a substitute such as methyl group or an ethyl group.

The polyimide of the present invention can be produced by cyclodehydrating a polyamic acid having a structural unit represented by the formula (18).

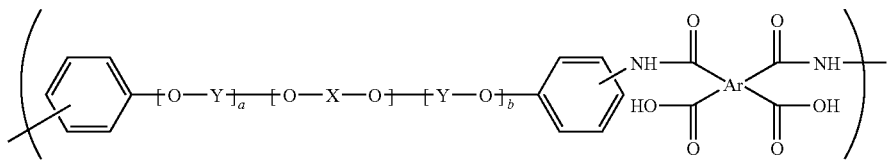

(18)

wherein —(O—X—O)— is a structure defined by the formula (2) or the formula (3), —(Y—O)— is an arrangement of one kind of structure defined by the formula (4) or a random arrangement of at least two kinds of structures defined by the formula (4), each of a and b is an integer of 0 to 100, provided that at least one of a and b is not 0, and Ar represents a tetravalent aromatic group selected from the group consisting of a monocyclic aromatic group, a condensed polycyclic aromatic group and a non-condensed polycyclic aromatic group having a structure in which monocyclic aromatic groups are connected to each other directly or through a connecting group.

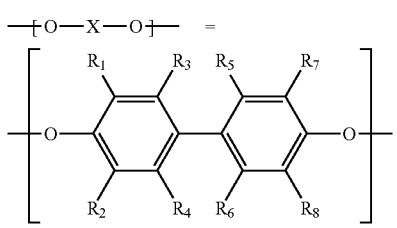

(2)

wherein $R_1$, $R_2$, $R_3$, $R_7$ and $R_8$ are the same or different and represent an alkyl group having 6 or less carbon atoms or a phenyl group and $R_4$, $R_5$ and $R_6$ are the same or different and represent a hydrogen atom, an alkyl group having 6 or less carbon atoms or a phenyl group.

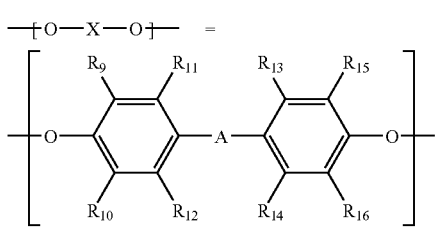

(3)

wherein $R_9$, $R_{10}$, $R_{11}$, $R_{12}$, $R_{13}$, $R_{14}$, $R_{15}$ and $R_{16}$ are the same or different and represent a hydrogen atom, an alkyl group having 6 or less carbon atoms or a phenyl group and -A- represents a linear, branched or cyclic bivalent hydrocarbon group having 20 or less carbon atoms.

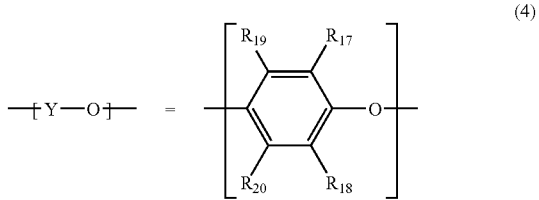

(4)

wherein $R_{17}$ and $R_{18}$ are the same or different and represent an alkyl group having 6 or less carbon atoms or a phenyl group and $R_{19}$ and $R_{20}$ are the same or different and represent a hydrogen atom, an alkyl group having 6 or less carbon atoms or a phenyl group.

As for imidation, it is possible to adopt a thermal imidation method or a chemical imidation method. As the thermal imidation method, for example, (1) a method in which a solution of a polyamic acid is flowed and expanded on a base plate having a flat and smooth surface such as a glass plate or a metal plate and then cyclodehydration is carried out by heating or (2) a method in which a solution of a polyamic acid is directly heated to carry out cyclodehydration is adopted. For example, an organic solvent which is used for the production of the polyamic acid, to be described later, can be used as a solvent in the above methods. In the above thermal imidation method (1), a thin film formed by flowing and expanding the polyamic acid solution on the base plate is heated under normal pressure or under reduced pressure, whereby a film-like polyimide can be obtained. The heating temperature for the cyclodehydration in this case is generally 100 to 400° C., preferably 150 to 350° C. It is preferred to gradually increase the temperature during the reaction. In the above thermal imidation method (2), the polyamic acid solution is heated, whereby a polyimide in the form of a powder or a solution can be obtained. The heating temperature for the cyclodehydration in this case is generally 80 to 300° C., preferably 100 to 250° C. In the above thermal imidation method (2), a component which is azeotropic with water and, in particular, can be easily separated from water outside a reaction system, such as an aromatic hydrocarbon typified by benzene, toluene or xylene, can be used as a dehydrating agent for the purpose of easily removing water generated as a by-product. Further, a catalyst such as a tertiary amine can be used for accelerating the cyclodehydration in the above thermal imidation method (2). The amount of the catalyst is, for example, 10 to 400 parts by weight based on 100 parts by weight of the polyamic acid. Examples of the tertiary amine as the catalyst include aliphatic tertiary amines such as trimethylamine, triethylamine, tri-n-propylamine, tri-1-propylamine and tri-n-butylamine; aromatic tertiary amines such as N,N-dimethylaniline and N,N-diethylaniline; and heterocyclic tertiary amines such as pyridine, quinoline and isoquinoline.

As the chemical imidation method, for example, (3) a method in which poly-imidation is carried out in the state of a solution by the use of a cyclization agent capable of cyclo-dehydrating a polyamic acid is adopted, whereby a polyimide is obtained in the form of a powder or a solution. For example, an organic solvent which is used for the production of the polyamic acid, to be described later, can be used as a solvent for this method. Examples of the cyclization agent used in the chemical imidation method (3) include acid anhydrides such as acetic anhydride, propionic anhydride and butyric anhydride. The cyclization agent can be used singly or at least two cyclization agents can be used in combination. The amount of the cyclization agent is generally 2 to 100 mol, preferably 2 to 50 mol, per 1 mol of a repeating unit of the polyamic acid. The reaction temperature in the chemical imidation method (3) is generally 0 to 200° C. Further, a tertiary amine can be used as a catalyst also in the chemical imidation method similarly to the above thermal imidation method. When the polyimide is obtained in the form of a powder by the above thermal imidation method or the chemical imidation method, the polyimide powder can be separated and recovered from a medium by proper means such as filtration, spray drying or steam distillation. The imidation rate of the polyimide of the present invention is 50% or more, preferably 90% or more.

Then, the polyamic acid of the present invention will be explained.

In the polyamic acid having a structural unit represented by the formula (18), —(O—X—O)— represents a structure defined by the formula (2) or the formula (3), —(Y—O)— represents an arrangement of one kind of structure defined by the formula (4) or a random arrangement of at least two kinds of structures defined by the formula (4), Ar represents a tetravalent aromatic group selected from the group consisting of a monocyclic aromatic group, a condensed polycyclic aromatic group and a non-condensed polycyclic aromatic group having a structure in which monocyclic aromatic groups are connected to each other directly or through a connecting group, and each of a and b is an integer of 0 to 100, provided that at least one of a and b is not 0. In the formula (2), $R_1$, $R_2$, $R_3$, $R_7$ and $R_8$ are the same or different and represent an alkyl group having 6 or less carbon atoms or a phenyl group and $R_4$, $R_5$ and $R_6$ are the same or different and represent a hydrogen atom, an alkyl group having 6 or less carbon atoms or a phenyl group. In the formula (3), $R_9$, $R_{10}$, $R_{11}$, $R_{12}$, $R_{13}$, $R_{14}$, $R_{15}$ and $R_{16}$ are the same or different and represent a hydrogen atom, an alkyl group having 6 or less carbon atoms or a phenyl group and -A- represents a linear, branched or cyclic bivalent hydrocarbon group having 20 or less carbon atoms. In the formula (4), $R_{17}$ and $R_{18}$ are the same or different and represent an alkyl group having 6 or less carbon atoms or a phenyl group and $R_{19}$ and $R_{20}$ are the same or different and represent a hydrogen atom, an alkyl group having 6 or less carbon atoms or a phenyl group.

In particular, preferred are a polyamic acid having a structural unit of the formula (18) wherein $R_1$, $R_2$, $R_3$, $R_7$ and $R_8$ in the formula (2) represent an alkyl group having 3 or less carbon atoms and $R_4$, $R_5$ and $R_6$ in the formula (2) represent a hydrogen atom or an alkyl group having 3 or less carbon atoms, a polyamic acid having a structural unit of the formula (18) wherein $R_9$, $R_{10}$, $R_{11}$, $R_{12}$, $R_{13}$, $R_{14}$, $R_{15}$ and $R_{16}$ in the formula (3) represent a hydrogen atom or an alkyl group having 3 or less carbon atoms and a polyamic acid having a structural unit of the formula (18) wherein $R_{17}$ and $R_{18}$ in the formula (4) represent an alkyl group having 3 or less carbon atoms and $R_{19}$ and $R_{20}$ in the formula (4) represent a hydrogen atom or an alkyl group having 3 or less carbon atoms.

Especially preferred is a polyamic acid having a structural unit of the formula (18) wherein —(O—X—O)— represented by the formula (2) is represented by the formula (6) or —(O—X—O)— represented by the formula (3) is represented by the formula (7) or the formula (8) and —(Y—O)— represented by the formula (4) is an arrangement of a structure of the formula (9) or the formula (10) or a random arrangement of a structure of the formula (9) and a structure of the formula (10).

Examples of Ar in the formula (18) include tetravalent aromatic groups having molecular structures such as molecular structures of benzene, biphenyl, naphthalene, benzophenone, 2,2-diphenylpropane, 2,2-diphenyl-1,1,1,3,3,3-hexafluoropropane, diphenyl ether, diphenyl sulfone, 9,9-diphenylfluorene and perylene. Ar is not limited to these.

Further, Ar in the formula (18) can be a tetravalent non-condensed polycyclic aromatic group in which monocyclic aromatic groups such as benzene or biphenyl are connected to each other through a connecting group such as an oxygen atom, a carbonyl group, an ester group, methylene, ethylidene, 1-methylethylidene, 1,1-propylidene, 1,4-phenylenebis(1-methylethylidene), 1,3-phenylenebis(1-methylethylidene), cyclohexylidene, phenylmethylene, naphthylmethylene or 1-phenylethylidene. The aromatic group used for Ar can have a substituent such as a methyl group or an ethyl group.

Of these, a tetravalent aromatic group having 6 to 30 carbon atoms or a tetravalent aromatic group represented by the formula (11) is preferred as Ar. Further preferably, the structural unit of the formula (18) is a structural unit represented by the formula (20), the formula (21) or the formula (22).

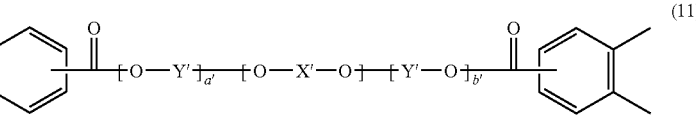

(11)

wherein —(O—X'—O)— is a structure defined by the formula (12) or the formula (13), —(Y'—O)— is an arrangement of one kind of structure defined by the formula (14) or a random arrangement of at least two kinds of structures defined by the formula (14) and each of a' and b' is an integer of 0 to 100, provided that at least one of a' and b' is not 0.

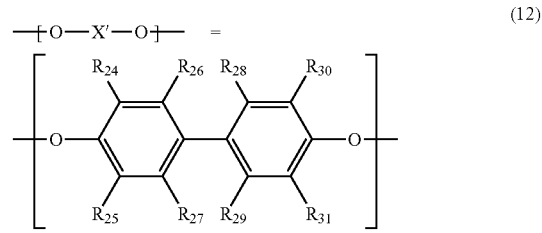

(12)

wherein $R_{24}, R_{25}, R_{26}, R_{30}$ and $R_{31}$ are the same or different and represent an alkyl group having 6 or less carbon atoms or a phenyl group and $R_{27}, R_{28}$ and $R_{29}$ are the same or different and represent a hydrogen atom, an alkyl group having 6 or less carbon atoms or a phenyl group.

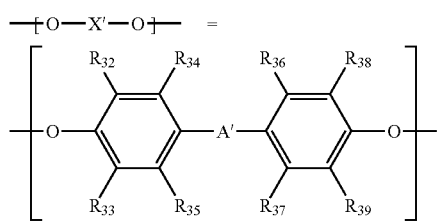

(13)

wherein $R_{32}, R_{33}, R_{34}, R_{35}, R_{36}, R_{37}, R_{38}$ and $R_{39}$ are the same or different and represent a hydrogen atom, an alkyl group having 6 or less carbon atoms or a phenyl group and -A'- represents a linear, branched or cyclic bivalent hydrocarbon group having 20 or less carbon atoms.

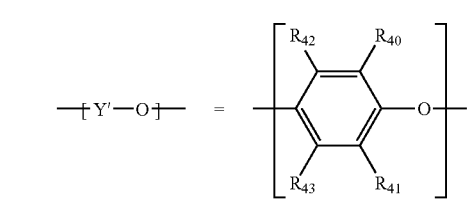

(14)

wherein $R_{40}$ an $R_{41}$ are the same or different and represent an alkyl group having 6 or less carbon atoms or a phenyl group and $R_{42}$ and $R_{43}$ are the same or different and represent a hydrogen atom, an alkyl group having 6 or less carbon atoms or a phenyl group.

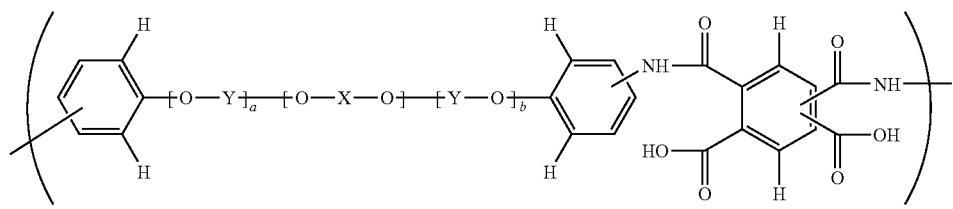

(20)

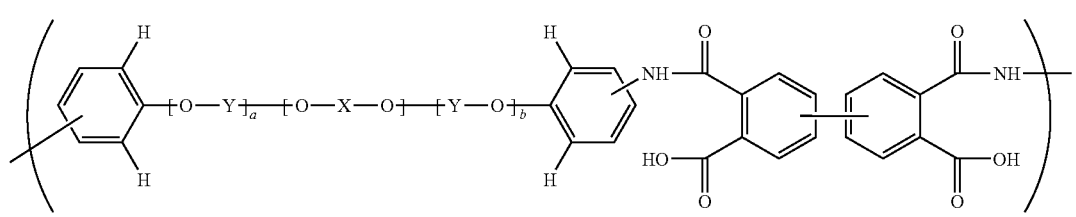

(21)

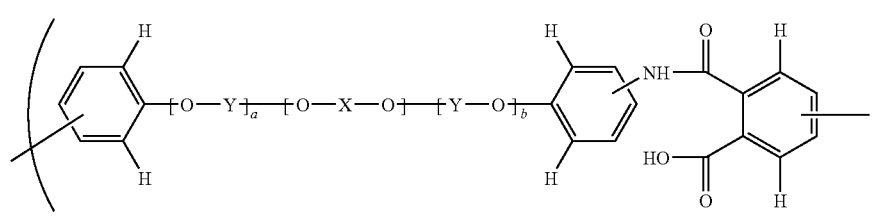

(22)

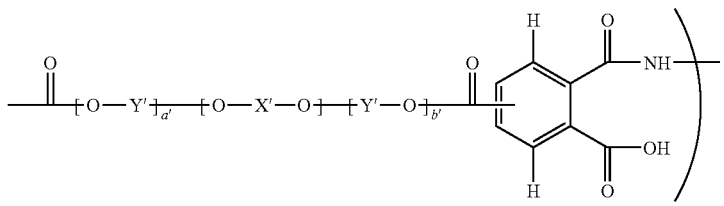

Examples of -A- in the formula (4) include bivalent organic groups such as methylene, ethylidene, 1-methylethylidene, 1,1-propylidene, 1,4-phenylenebis(1-methylethylidene), 1,3-phenylenebis(1-methylethylidene), cyclohexylidene, phenylmethylene, naphthylmethylene and 1-phenylethylidene. -A- in the formula (4) is not limited to these examples.

The polyamic acid of the present invention can further contain a structural unit represented by the formula (19) in a formula (18):formula (19) ratio of 100:0-50:50.

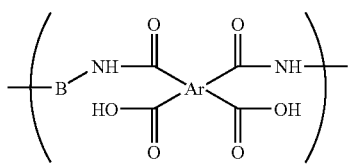
(19)

wherein Ar represents a tetravalent aromatic group selected from the group consisting of a monocyclic aromatic group, a condensed polycyclic aromatic group and a non-condensed polycyclic aromatic group having a structure in which monocyclic aromatic groups are connected to each other directly or through a connecting group and B represents a bivalent aromatic group having 6 to 30 carbon atoms which is selected from the group consisting of a monocyclic aromatic group, a condensed polycyclic aromatic group and a non-condensed polycyclic aromatic group having a structure in which monocyclic aromatic groups are connected to each other directly or through a connecting group.

Examples of B, which represents a bivalent aromatic groups having 6 to 30 carbon atoms, include monocyclic aromatic groups such as 1,3-phenylene, 1,4-phenylene, 4,4'-biphenylene, 5-chloro-1,3-phenylene and 5-methoxy-1,3-phenylene; condensed polycyclic aromatic groups such as 1,4-naphthylene, 2,6-naphthylene, 1,4-anthrylene, 9,10-anthrylene and 3,4-perylenylene; and bivalent non-condensed polycyclic aromatic groups having a structure in which monocyclic aromatic groups, typified by phenyl or biphenyl, are connected to each other through a connecting group, such as 2,2-propylidenebis(1,4-phenylene), 2,2-(1,1,1,3,3,3-hexafluoropropylidene)bis(1,4-phenylene), carbonylbis(1,4-phenylene), oxybis(1,4-phenylene), sulfonylbis(1,4-phenylene) and 9,9-fluorenylidenebis(1,4-phenylene). Examples of the above connecting group include an oxygen atom, a carbonyl group, an ester group, methylene, ethylidene, 1-methylethylidene, 1,1-propylidene, 1,4-phenylenebis(1-methylethylidene), 1,3-phenylenebis(1-methylethylidene), cyclohexylidene, phenylmethylene, naphthylmethylene or 1-phenylethylidene. B is not limited to these examples. Further, the aromatic group used for B can have a substitute such as methyl group or an ethyl group.

The polyamic acid of the present invention can be produced by condensation polymerization of a diamine represented by the formula (23) or a diamine represented by the formula (23) and a diamine represented by the formula (24) with an acid dianhydride in an organic solvent.

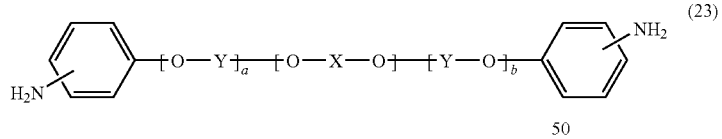
(23)

wherein —(O—X—O)— is a structure defined by the formula (2) or the formula (3), —(Y—O)— is an arrangement of one kind of structure defined by the formula (4) or a random arrangement of at least two kinds of structures defined by the formula (4), and each of a and b is an integer of 0 to 100, provided that at least one of a and b is not 0.

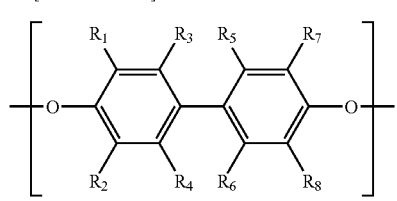
(2)

wherein $R_1$, $R_2$, $R_3$, $R_7$ and $R_8$ are the same or different and represent an alkyl group having 6 or less carbon atoms or a phenyl group and $R_4$, $R_5$ and $R_6$ are the same or different and represent a hydrogen atom, an alkyl group having 6 or less carbon atoms or a phenyl group.

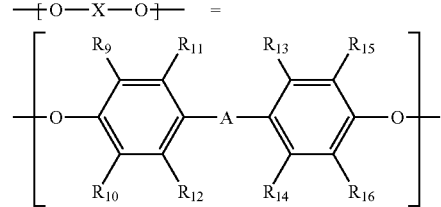
(3)

wherein $R_9$, $R_{10}$, $R_{11}$, $R_{12}$, $R_{13}$, $R_{14}$, $R_{15}$ and $R_{16}$ are the same or different and represent a hydrogen atom, an alkyl group having 6 or less carbon atoms or a phenyl group and -A- represents a linear, branched or cyclic bivalent hydrocarbon group having 20 or less carbon atoms.

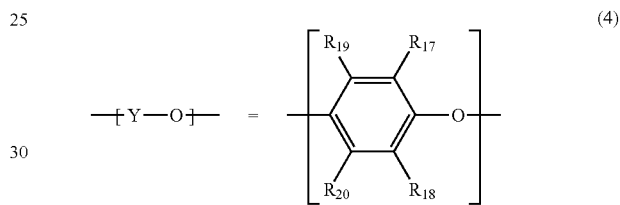
(4)

wherein $R_{17}$ and $R_{18}$ are the same or different and represent an alkyl group having 6 or less carbon atoms or a phenyl group and $R_{19}$ and $R_{20}$ are the same or different and represent a hydrogen atom, an alkyl group having 6 or less carbon atoms or a phenyl group.

$$H_2N-B-NH_2 \qquad (24)$$

wherein B represents a bivalent aromatic group having 6 to 30 carbon atoms which is selected from the group consisting of a monocyclic aromatic group, a condensed polycyclic aromatic group and a non-condensed polycyclic aromatic group having a structure in which monocyclic aromatic groups are connected to each other directly or through a connecting group.

The method for producing the diamine represented by the formula (23) is not specially limited. The diamine of the formula (23) can be produced by any method. For example, the diamine of the formula (23) can be produced by reducing a bifunctional phenylene ether oligomer dinitro compound obtained by reacting a bifunctional phenylene ether oligomer, which is obtained by oxidative coupling of a bifunctional phenol compound and a monofunctional phenol compound, with a nitro halobenzene compound or a dinitro benzene compound in an organic solvent in the presence of a basic compound.

The method of the above reduction of the bifunctional phenylene ether oligomer dinitro compound is not specially limited. For example, it is possible to adopt a known method in which a nitro group is reduced to an amino group. The reduction reaction of the bifunctional phenylene ether oligomer dinitro compound is carried out by, for example, reducing the bifunctional phenylene ether oligomer dinitro compound to an bifunctional phenylene ether oligomer diamino compound by use of hydrogen in a reaction solvent, which is inactive in the reaction, at a temperature of 20 to 200° C. at a pressure of normal pressure to 50 kgf/cm$^2$ in the presence of a hydrogenation catalyst such as a metal catalyst typified by nickel, palladium or platinum, a supported catalyst in which such a metal is carried on a proper support, or a Raney catalyst of nickel, copper or the like. Examples of the above reaction solvent include aliphatic alcohols such as methanol, ethanol and isopropanol, ethylene glycol monoalkyl ethers such as methyl cellosolve and ethyl cellosolve, aromatic hydrocarbons such as toluene, benzene and xylene, and ethers such as tetrahydrofuran, dioxane, dipropyl ether, diethylene glycol dimethyl ether, diethylene glycol ethyl methyl ether and diethylene glycol diethyl ether. The reaction solvent is not limited to these examples so long as it is a solvent which dissolves the bifunctional phenylene ether oligomer dinitro compound. The reaction solvent may be used singly or at least two reaction solvents may be used in combination.

The number average molecular weight of the diamine of the formula (23) is preferably in the range of from 500 to 3,000. The dispersity (weight average molecular weight/number average molecular weight) is preferably in the range of 1 to 3. When the number average molecular weight is less than 500, it is difficult to obtain electric characteristics possessed by a phenylene ether structure. When it exceeds 3,000, the reactivity of a terminal functional group is decreased and the solubility into solvent is also decreased. When the dispersity exceeds 3, the solubility into solvent is decreased.

The substitution position of an amino group of the diamine represented by the formula (23) is not specially limited so long as it is a para position or a meta position with regard to the substitution position of an oxygen atom.

Then, the bifunctional phenylene ether oligomer dinitro compound, which can be a precursor of the diamine represented by the formula (23), will be explained. The method for producing the bifunctional phenylene ether oligomer dinitro compound is not specially limited. The bifunctional phenylene ether oligomer dinitro compound can be produced by any method. For example, the bifunctional phenylene ether oligomer dinitro compound is produced by reacting a bifunctional phenylene ether oligomer, which is obtained by oxidative coupling of a bifunctional phenol compound and a monofunctional phenol compound, with a nitro halobenzene compound or a dinitro benzene compound in an organic solvent in the presence of a basic compound at a temperature of 50 to 250° C., preferably 50 to 180° C., for 0.5 to 24 hours. The method for producing the bifunctional phenylene ether oligomer dinitro compound can be selected from known methods. For example, the methods described in JP-A-4-178358, JP-A-2006-219396, etc., can be adopted.

The above-mentioned bifunctional phenylene ether oligomer can be produced by, for example, dissolving a bifunctional phenol compound, a monofunctional phenol compound and a catalyst in a solvent and then introducing oxygen into the resultant solution under heat with stirring. Examples of the bifunctional phenol compound include 2,2',3,3',5,5'-hexamethyl-(1,1'-biphenyl)-4,4'-diol, 4,4'-methylenebis(2,6-dimethylphenol), 4,4'-dihydroxyphenyl methane and 2,2-bis (4-hydroxyphenyl)propane. The bifunctional phenol compound is not limited to these examples. The monofunctional phenol compound is typically 2,6-dimethylphenol or 2,3,6-trimethylphenol. The monofunctional phenol compound is not limited to these. The catalyst is, for example, a combination of a copper salt and an amine. Examples of the copper salt include CuCl, CuBr, CuI, CuCl$_2$ and CuBr$_2$. Examples of the amine include di-n-butylamine, n-butyldimethylamine, N,N'-di-t-butylethylenediamine, pyridine, N,N, N'N'-tetramethylethylenediamine, piperidine and imidazole. The catalyst is not limited to these examples. Examples of the solvent include toluene, methanol, methyl ethyl ketone and xylene. The solvent is not limited to these examples.

Examples of the diamine represented by the formula (24) include p-phenylenediamine, m-phenylenediamine, 3,4'-diaminodiphenylether, 4,4'-diaminodiphenylether, 1,5-naphthylenediamine, 4,4'-diaminodiphenylmethane, 3,4'-diaminodiphenylsulfone, 4,4'-diaminodiphenylsulfone, 2,4-diaminochlorobenzene, 2,2-bis[4-(4-aminophenoxy)phenyl] propane, 2,2-[4-(4-aminophenoxyphenyl)][4-(3-aminophenoxyphenyl)]propane, 2,2-bis[3-(3-aminophenoxy)phenyl]-1,1,1,3,3,3-hexafluoropropane, 2,2-bis[4-(4-aminophenoxy)phenyl]-1,1,1,3,3,3-hexafluoropropane, 2,2-[4-(4-aminophenoxyphenyl)][4-(3-aminophenoxyphenyl)-1,1,1,3,3,3-hexafluoropropane, 1,3-bis(3-aminophenoxy)benzene, 1,4-bis(3-aminophenoxy) benzene, 1,4-bis(4-aminophenoxy)benzene, 1,3-bis(4-aminophenoxy)benzene and 4,4'-bis(4-aminophenoxy) biphenyl. The amount of the diamine of the formula (24) is 50 mol % or less based on the total of the diamine components. The diamine of the formula (24) can be used singly or a mixture of at least two diamines of the formula (24) can be used.

Examples of the acid dianhydride include pyromellitic dianhydride, 1,2,3,4-benzenetetracarboxylic dianhydride, 3,3',4,4'-benzophenonetetracarboxylic dianhydride, 2,2',3,3'-benzophenonetetracarboxylic dianhydride, 3,3',4,4'-biphenyltetracarboxylic dianhydride, 2,2',3,3'-biphenyltetracarboxylic dianhydride, 2,3,3',4'-biphenyltetracarboxylic dianhydride, 2,2-bis(3,4-dicarboxyphenyl)propane dianhydride, 2,2-bis(2,3-dicarboxyphenyl)propane dianhydride, bis (3,4-dicarboxyphenyl)ether dianhydride, bis(2,3-dicarboxyphenyl)ether dianhydride, bis(3,4-dicarboxyphenyl)sulfone dianhydride, bis(2,3-dicarboxyphenyl)sulfone dianhydride, 2,3-bis(3,4-dicarboxyphenyl)-1,1,1,3,3,3-hexafluoropropane dianhydride, 2,2-bis(2,3-dicarboxyphenyl)-1,1,1,3,3,3-hexafluoropropane dianhydride, 9,9-bis(4-(3,4-dicarboxyphenoxy)phenyl)fluorene dianhydride, 9,9-bis(4-(2,3-dicarboxyphenoxy)phenyl)fluorene dianhydride, 2,3,6,7-naphthalenetetracarboxylic dianhydride, 1,4,5,8-naphthalenetetracarboxylic dianhydride, 3,4,9,10-perylenetetracarboxylic dianhydride and an acid dianhydride represented by the formula (25).

Among these acid dianhydrides, pyromellitic dianhydride, 2,2',3,3'-biphenyltetracarboxylic dianhydride, 3,3',4,4'-biphenyltetracarboxylic dianhydride, 2,3,3',4'-biphenyltetracarboxylic dianhydride and the acid dianhydride represented by the formula (25) are preferred. The acid dianhydride can be used singly or at least two acid dianhydrides can be used in combination.

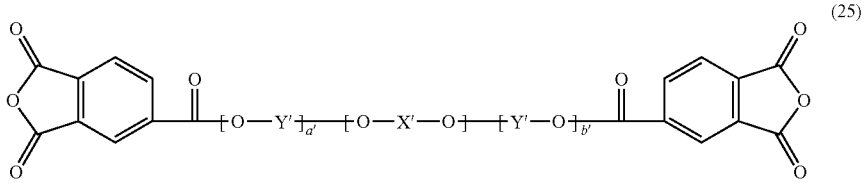

(25)

wherein —(O—X'—O)— is a structure defined by the formula (12) or the formula (13), —(Y'—O)— is an arrangement of one kind of structure defined by the formula (14) or a random arrangement of at least two kinds of structures defined by the formula (14) and each of a' and b' is an integer of 0 to 100, provided that at least one of a' and b' is not 0.

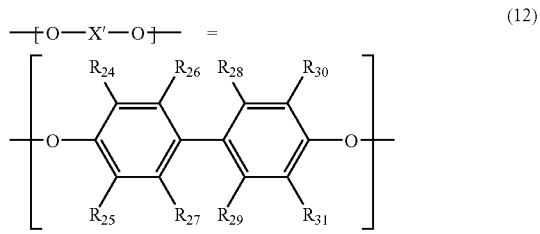

(12)

wherein $R_{24}$, $R_{25}$, $R_{26}$, $R_{30}$ and $R_{31}$ are the same or different and represent an alkyl group having 6 or less carbon atoms or a phenyl group and $R_{27}$, $R_{28}$ and $R_{29}$ are the same or different and represent a hydrogen atom, an alkyl group having 6 or less carbon atoms or a phenyl group.

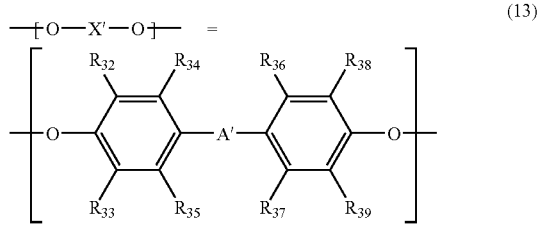

(13)

wherein $R_{32}$, $R_{33}$, $R_{34}$, $R_{35}$, $R_{36}$, $R_{37}$, $R_{38}$ and $R_{39}$ are the same or different and represent a hydrogen atom, an alkyl group having 6 or less carbon atoms or a phenyl group and -A'- represents a linear, branched or cyclic bivalent hydrocarbon group having 20 or less carbon atoms.

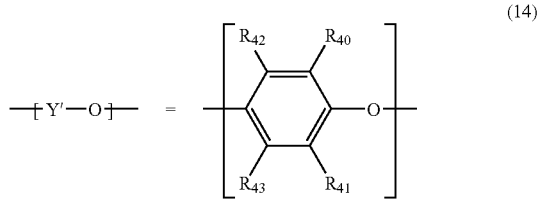

(14)

wherein $R_{40}$ an $R_{41}$ are the same or different and represent an alkyl group having 6 or less carbon atoms or a phenyl group and $R_{42}$ and $R_{43}$ are the same or different and represent a hydrogen atom, an alkyl group having 6 or less carbon atoms or a phenyl group.

The method for producing the acid dianhydride represented by the formula (25) is not specially limited. The acid dianhydride of the formula (25) can be produced by any method. For example, the acid dianhydride of the formula (25) can be obtained by reacting the aforementioned bifunctional phenylene ether oligomer with trimellitic anhydride chloride in the presence of a base such as pyridine or triethylamine. A solvent which does not react with an acid anhydride and an acid chloride such as toluene, xylene, dichloromethane or chloroform can be used as a solvent for the above reaction. It is preferred to carry out the reaction in an atmosphere of an inert gas such as nitrogen or argon in order to prevent the deactivation of the acid anhydride and the acid chloride.

The acid dianhydride represented by the formula (25) can be also obtained by reacting the aforementioned bifunctional phenylene ether oligomer with trimellitic anhydride in the presence of a condensing agent. A known esterification agent such as sulfuric acid can be used as the condensing agent. A solvent which does not react with an acid anhydride such as toluene or xylene can be used as a solvent for the above reaction. It is preferred to carry out the reaction in an atmosphere of an inert gas such as nitrogen or argon in order to prevent the deactivation of the acid anhydride.

The number average molecular weight of the acid dianhydride represented by the formula (25) is preferably in the range of 500 to 3,000. The dispersity (weight average molecular weight/number average molecular weight) is preferably in the range of 1 to 3.

The polyamic acid of the present invention can be produced by using at least two kinds of diamines represented by the formula (23), at least two kinds of diamines represented by the formula (24) or at least two kinds of acid dianhydrides. The polyamic acid can be a block copolymer in which an amic acid having the same repeating unit repeats to a certain extent and then another kind of amic acid repeats to a certain extent or a random copolymer in which amic acids obtained from different raw materials are respectively repeated at random.

The reaction between the diamine and the acid dianhydride is generally carried out in an organic solvent. Examples of the organic solvent include N,N-dimethylformamide, N,N-dimethylacetamide, N,N-dimethylmethoxyacetamide, N,N-diethylmethoxyacetamide, N-methyl-2-pyrrolidone, N-methylcaprolactam, 1,2-dimethoxyethane, diethylene glycol dimethyl ether, diethylene glycol ethyl methyl ether, diethylene glycol diethyl ether, tetrahydrofuran, 1,3-dioxane, 1,4-dioxane, pyridine, picoline, dimethylsulfoxide, dimethylsulfone and tetramethylurea. The organic solvent can be used singly or at least two organic solvents can be used in combination. The concentration of the reaction raw materials in the aforesaid condensation polymerization reaction is generally 2 to 50 wt %, preferably 5 to 30 wt %. The reaction temperature is generally 60° C. or lower, preferably 50° C. or lower. The reaction pressure is not specially limited. Generally, the condensation polymerization can be carried out under normal pressure. Further, the reaction time is generally 0.5 to 24 hours. The polyamic acid of the present invention can be obtained by the above-explained condensation polymerization.

The reduction viscosity (N,N-dimethylacetamide solvent, 25° C., concentration 0.5 g/dl) of the polyamic acid of the present invention is preferably 0.1 to 5 dl/g.

Further, the polyamic acid of the present invention can be partially imidized so long as the imidation rate does not exceed 50%.

The film of the present invention will be explained.

The film made of the polyimide of the present invention is obtained by applying a solution containing the polyimide of the present invention or the polyamic acid of the present invention to a surface of a supporting material such as a glass plate, a metal plate or a plastic film with a device such as a bar coater, a die coater, a doctor blade or a baker applicator, carrying out drying and cyclodehydration by heating, and then removing the supporting material. As for the heating conditions for the cyclodehydration, the temperature is generally 100° C. to 400° C., preferably 150° C. to 350° C., and it is preferred to gradually increase the temperature. The heating time is preferably 1 to 10 hours. It is possible to use a reduced pressure or use an atmosphere of an inert gas such as nitrogen or argon during the heating, as required. As the method of removing the supporting material, peeling-off, etching or the like is used. The supporting material can be removed before the completion of the drying and cyclodehydration. It is possible to adopt a method in which the drying and cyclodehydration are carried out until the applied solution becomes capable of supporting itself, then, it is peeled off from the supporting material, and then, drying and cyclodehydration are carried out again. When the thickness of the applied solution is large, a solvent is apt to remain. Therefore, the thickness of the film of the present invention is preferably 0.1 to 500 μm, more preferably 0.5 to 200 μm.

The laminate of the present invention which has metal layer(s) on one side or both surfaces will be explained.

The laminate of the present invention can be obtained by a method in which the film of the present invention and a metal foil or a metal plate are pressure-bonded by heating and pressurization, a method in which the film of the present invention and a metal foil or a metal plate is bonded with an adhesive, a method in which a metal layer is formed on the film of the present invention by plating or sputtering or a method in which a solution of the polyamic acid of the present invention is flowed and expanded on a metal plate or a metal foil, followed by drying and cyclodehydration by heating, to form a polyimide.

EXAMPLES

The present invention will be more concretely explained with reference to Examples, hereinafter, while the present invention shall not be specially limited to these Examples. A number average molecular weight and a weight average molecular weight were obtained by a gel permeation chromatography (GPC) method (calculated as polystyrene). Tetrahydrofuran (THF) was used for a developing solvent for GPC. A hydroxyl group equivalent and an amino group equivalent were obtained by quantification of a terminal functional group by means of titration. A dielectric constant and a dielectric loss tangent were measured at 10 GHz by a cavity resonance perturbation method. In Examples of the present invention, the term "at a dried time" means the state of a sample after the sample was kept in a calcium chloride-containing desiccator (humidity 21%) at a temperature of 20° C. for 12 hours and the term "at a moisture-absorbed time" means the state of a sample after the sample is kept at a humidity of 50% at a temperature of 25° C. for 12 hours. As for the reduction viscosity of a polyamic acid, a polyamic acid solution was dissolved into N,N-dimethylacetamide such that the concentration became 0.5 g/dl, and then the reduction viscosity was measured at 25° C. with a Ubbelohde viscosimeter.

Synthetic Example 1

Synthesis of Bifunctional Phenylene Ether Oligomer

A 12 L longitudinally long reactor equipped with a stirrer, a thermometer, an air-introducing tube and baffleplates was charged with 3.88 g (17.4 mmol) of $CuBr_2$, 0.75 g (4.4 mmol) of N,N'-di-t-butylethylenediamine, 28.04 g (277.6 mmol) of n-butyldimethylamine and 2,600 g of toluene. The mixture was stirred at a reaction temperature of 40° C. Separately, 129.32 g (0.48 mol) of 2,2',3,3',5,5'-hexamethyl-(1,1'-biphenyl)-4,4'-diol, 292.19 g (2.40 mol) of 2,6-dimethylphenol, 0.51 g (2.9 mmol) of N,N'-di-t-butylethylenediamine and 10.90 g (108.0 mmol) of n-butyldimethylamine were dissolved in 2,300 g of methanol, to obtain a mixed solution. The mixed solution was dropwise added to the mixture in the reactor over 230 minutes with stirring while bubbling was carried out with a nitrogen-air mixed gas having an oxygen concentration of 8% at a flow velocity of 5.2 L/min. After the completion of the addition, 1,500 g of water containing 19.89 g (52.3 mmol) of tetrasodium ethylenediamine tetraacetate dissolved therein was added to the mixture to terminate the reaction. An aqueous layer and an organic layer were separated. The organic layer was washed with 1N hydrochloric acid aqueous solution and then washed with pure water. The thus-obtained solution was concentrated with an evaporator and then dried under reduced pressure at 120° C. for 3 hours, to obtain 416.7 g of a bifunctional phenylene ether oligomer (resin "A"). The resin "A" had a number average molecular weight of 1,035, a weight average molecular weight of 1,598 and a hydroxyl group equivalent of 435.

(Synthesis of Bifunctional Phenylene Ether Oligomer Dinitro Compound)

A 2 L reactor vessel equipped with a stirrer, a reflux condenser and a thermometer was charged with 999.3 g of N,N-dimethylacetamide, 250.4 g of the resin "A", 89.4 g (0.63 mol) of 4-fluoronitrobenzene and 95.3 g (0.69 mol) of potassium carbonate. The atmosphere in the reactor vessel was replaced with nitrogen. Then, the resultant mixture was heated and the mixture was continuously stirred for 5 hours at 110° C., to allow the mixture to react. After the completion of the reaction, filtering was carried out at 90 to 100° C. to remove an inorganic salt. Then, the thus-obtained filtrate was cooled down to room temperature. The filtrate was poured to a mixed solvent of 1,000 g of methanol and 500 g of pure water, to precipitate a solid. The solid was recovered by filtering, washed with methanol and dried, to obtain 286.9 g of a bifunctional phenylene ether oligomer dinitro compound (resin "B"). The resin "B" had a number average molecular weight of 1,246 and a weight average molecular weight of 1,779. An infrared absorption spectrum (IR) of the resin "B" showed absorptions at a wavenumber of 1,520 $cm^{-1}$ and a wavenumber of 1,343 $cm^{-1}$, which correspond to an N—O bond.

(Synthesis of Bifunctional Phenylene Ether Oligomer Diamine)

Then, a 2 L reactor vessel equipped with a stirrer was charged with 100.0 g of the resin "B", 600 g of N,N-dimethylacetamide and 2.5 g of a 5% Pd/alumina catalyst. The mixture was stirred under a hydrogen atmosphere at 80° C. for 7.5 hours, to allow the mixture to react. Then, the resultant reaction solution was filtered, to remove the catalyst, and then poured to 1,000 g of pure water, to precipitate a solid. The solid was recovered by filtering, washed with pure water and dried, to obtain 85.1 g of a bifunctional phenylene ether oligomer diamine (resin "C"). The resin "C" had a number average molecular weight of 1,269, a weight average molecular weight of 1,788 and an amino group equivalent of 590. An infrared absorption spectrum (IR) of the resin "C" showed absorptions at a wavenumber of 3,448 $cm^{-1}$ and a wavenumber of 3,367 $cm^{-1}$, which correspond to an N—H bond.

(Synthesis of Bifunctional Phenylene Ether oligomer Acid Dianhydride)

A 200 ml reactor equipped with a stirrer, a thermometer, a dropping funnel and a reflux tube was charged with 6.31 g (0.03 mol) of trimellitic anhydride chloride and 40 g of toluene. The mixture was stirred under heat at 70° C. under nitrogen, and 8.27 g (hydroxyl group 0.019 mol) of the resin "A", 2.41 g of pyridine and 80 g of toluene placed in the dropping funnel were dropwise added over 1 hour. After the completion of the addition, the resultant mixture was further heated and refluxed for 2 hours. After the completion of the reaction, the reactor was cooled by ice bath. The thus-precipitated trimellitic anhydride chloride and pyridine hydrochloride were removed by filtering. The thus-obtained filtrate was evaporated and dried under reduced pressure, to obtain 11.6 g of an acid dianhydride (resin "D") represented by the aforementioned formula (24). The resin "D" had a number average molecular weight of 1,343 and a weight average molecular weight of 2,782. The structure of the resin "D" was confirmed by nuclear magnetic resonance spectrum and infrared spectroscopic spectrum.

Synthetic Example 2

Synthesis of Bifunctional Phenylene Ether Oligomer

A 12 L longitudinally long reactor equipped with a stirrer, a thermometer, an air-introducing tube and baffleplates was charged with 9.36 g (42.1 mmol) of $CuBr_2$, 1.81 g (10.5 mmol) of N,N'-di-t-butylethylenediamine, 67.77 g (671.0 mmol) of n-butyldimethylamine and 2,600 g of toluene. The mixture was stirred at a reaction temperature of 40° C. Separately, 129.31 g (0.48 mol) of 2,2',3,3',5,5'-hexamethyl-(1,1'-biphenyl)-4,4'-diol, 878.4 g (7.2 mol) of 2,6-dimethylphenol, 1.22 g (7.2 mmol) of N,N'-di-t-butylethylenediamine and 26.35 g (260.9 mmol) of n-butyldimethylamine were dissolved in 2,300 g of methanol, to obtain a mixed solution. The mixed solution was dropwise added to the mixture in the reactor over 230 minutes with stirring while bubbling was carried out with a nitrogen-air mixed gas having an oxygen concentration of 8% at a flow velocity of 5.2 L/min. After the completion of the addition, 1,500 g of water containing 48.06 g (126.4 mmol) of tetrasodium ethylenediamine tetraacetate dissolved therein was added to the mixture to terminate the reaction. An aqueous layer and an organic layer were separated. Then, the organic layer was washed with 1N hydrochloric acid aqueous solution and then washed with pure water. The thus-obtained solution was concentrated with an evaporator and then dried under reduced pressure at 120° C. for 3 hours, to obtain 990.5 g of a bifunctional phenylene ether oligomer (resin "E"). The resin "E" had a number average molecular weight of 1,975, a weight average molecular weight of 3,514 and a hydroxyl group equivalent of 990.

(Synthesis of Bifunctional Phenylene Ether Oligomer Dinitro Compound)

A 500 ml reactor vessel equipped with a stirrer, a reflux condenser, a thermometer and a Dean and Stark water separator was charged with 250.2 g of N,N-dimethylformamide, 148.5 g of the resin "E", 52.1 g (0.33 mol) of 4-chloronitrobenzene and 25.0 g (0.18 mol) of potassium carbonate. 20.0 g of toluene was added to the reactor vessel. The atmosphere in the reactor vessel was replaced with nitrogen. Then, the resultant mixture was heated and the mixture was continuously stirred for 5 hours at a temperature of 140 to 150° C., to allow the mixture to react. Water generated by the reaction was sequentially removed by azeotropy with toluene. After the completion of the reaction, filtering was carried out at 80 to 90° C., to remove an inorganic salt. Then, the thus-obtained filtrate was cooled down to room temperature. The filtrate was poured to 320.1 g of methanol, to precipitate a solid. The solid was recovered by filtering, washed with methanol and then dried, to obtain 140.3 g of a bifunctional phenylene ether oligomer dinitro compound (resin "F"). The resin "F" had a number average molecular weight of 3,081 and a weight average molecular weight of 5,587. An infrared absorption spectrum (IR) of the resin "F" showed absorptions at a wavenumber of 1,519 $cm^{-1}$ and a wavenumber of 1,342 $cm^{-1}$, which correspond to an N—O bond.

(Synthesis of Bifunctional Phenylene Ether Oligomer Diamine)

Then, a 300 ml reactor vessel equipped with a stirrer was charged with 3.60 g of the resin "F", 105.0 g of N,N-dimethylformamide and 0.468 g of a 5% Pd/C catalyst. The mixture was allowed to react under a hydrogen atmosphere at room temperature for 8 hours with vigorously stirring. Then, the resultant reaction solution was filtered to remove the catalyst, then concentrated with an evaporator and then dried under reduced pressure, to obtain 2.97 g of a bifunctional phenylene ether oligomer diamine (resin "G"). The resin "G" had a number average molecular weight of 2,905, a weight average molecular weight of 6,388 and an amino group equivalent of 1,351. An infrared absorption spectrum (IR) of the resin "G" showed absorptions at a wavenumber of 3,447 $cm^{-1}$ and a wavenumber of 3,365 $cm^{-1}$, which correspond to an N—H bond.

Synthetic Example 3

Synthesis of Bifunctional Phenylene Ether Oligomer

A 12 L longitudinally long reactor equipped with a stirrer, a thermometer, an air-introducing tube and baffleplates was charged with 13.1 g (0.12 mol) of CuCl, 707.0 g (5.5 mol) of di-n-butylamine and 4,000 g of methyl ethyl ketone. The mixture was stirred at a reaction temperature of 40° C. Separately, 410.2 g (1.6 mol) of 4,4'-methylenebis(2,6-dimethylphenol) and 586.5 g (4.8 mol) of 2,6-dimethylphenol were dissolved in 8,000 g of methyl ethyl ketone to obtain a solution. The solution was dropwise added to the mixture in the reactor over 120 minutes with stirring while bubbling was continuously carried out with 2 L/min of air. A disodium dihydrogen ethylenediamine tetraacetate aqueous solution was added to the resultant mixture to terminate the reaction. Then, washing was carried out with 1N hydrochloric acid aqueous solution three times and then washing was carried out with ion-exchanged water. The thus-obtained solution was concentrated with an evaporator and then dried under reduced pressure at 120° C. for 3 hours, to obtain 946.6 g of a bifunctional phenylene ether oligomer (resin "H"). The resin "H" had a number average molecular weight of 801, a weight average molecular weight of 1,081 and a hydroxyl group equivalent of 455.

(Synthesis of Bifunctional Phenylene Ether Oligomer Dinitro Compound)

A 500 ml reactor vessel equipped with a stirrer, a reflux condenser, a thermometer and a Dean and Stark water separator was charged with 200.2 g of N,N-dimethylformamide, 68.3 g of the resin "H", 52.2 g (0.33 mol) of 4-chloronitrobenzene and 24.9 g (0.18 mol) of potassium carbonate. 19.0 g of toluene was added to the reactor vessel. The atmosphere in the reactor vessel was replaced with nitrogen. Then, the resultant mixture was heated and the mixture was continuously stirred for 5 hours at a temperature of 140 to 150° C., to allow the mixture to react. Water generated by the reaction was sequentially removed by azeotropy with toluene. After the completion of the reaction, filtering was carried out at 80 to 90° C., to remove an inorganic salt. Then, the thus-obtained filtrate was cooled down to room temperature. The filtrate was poured to 290.2 g of methanol, to precipitate a solid. The solid was recovered by filtering, washed with methanol and then dried, to obtain 63.8 g of a bifunctional phenylene ether oligomer dinitro compound (resin "I"). The resin "I" had a number average molecular weight of 1,250 and a weight average molecular weight of 1,719. An infrared absorption spectrum (IR) of the resin "I" showed absorptions at a wavenumber of 1,522 $cm^{-1}$ and a wavenumber of 1,340 $cm^{-1}$, which correspond to an N—O bond.

(Synthesis of Bifunctional Phenylene Ether Oligomer Diamine)

Then, a 300 ml reactor vessel equipped with a stirrer was charged with 3.45 g of the resin "I", 90.0 g of N,N-dimethylformamide and 0.48 g of a 5% Pd/C catalyst. The mixture was allowed to react under a hydrogen atmosphere at room temperature for 6 hours with vigorously stirring. Then, the resultant reaction solution was filtered to remove the catalyst, then concentrated with an evaporator and then dried under reduced pressure, to obtain 2.64 g of a bifunctional phenylene ether oligomer diamine (resin "J"). The resin "J" had a number average molecular weight of 1,205, a weight average molecular weight of 2,009 and an amino group equivalent of 560. An infrared absorption spectrum (IR) of the resin "J" showed absorptions at a wavenumber of 3,446 $cm^{-1}$ and a wavenumber of 3,367 $cm^{-1}$, which correspond to an N—H bond.

Synthetic Example 4

Synthesis of Bifunctional Phenylene Ether Oligomer

A 12 L longitudinally long reactor equipped with a stirrer, a thermometer, an air-introducing tube and baffleplates was charged with 13.1 g (0.12 mol) of CuCl, 707.0 g (5.5 mol) of di-n-butylamine and 4,000 g of methyl ethyl ketone. The mixture was stirred at a reaction temperature of 40° C. Separately, 82.1 g (0.32 mol) of 4,4'-methylenebis(2,6-dimethylphenol) and 586.5 g (4.8 mol) of 2,6-dimethylphenol were dissolved in 8,000 g of methyl ethyl ketone to obtain a solution. The solution was dropwise added to the mixture in the reactor over 120 minutes with stirring while bubbling was continuously carried out with 2 L/min of air. A disodium dihydrogen ethylenediamine tetraacetate aqueous solution was added to the resultant mixture, to terminate the reaction. Then, washing was carried out with 1N hydrochloric acid aqueous solution three times and then washing was carried out with ion-exchanged water. The thus-obtained solution was concentrated with an evaporator and then dried under reduced pressure, to obtain 632.5 g of a bifunctional phenylene ether oligomer (resin "K"). The resin "K" had a number average molecular weight of 1,884, a weight average molecular weight of 3,763 and a hydroxyl group equivalent of 840.

(Synthesis of Bifunctional Phenylene Ether Oligomer Dinitro Compound)

A 500 ml reactor vessel equipped with a stirrer, a reflux condenser, a thermometer and a Dean and Stark water separator was charged with 250.5 g of N,N-dimethylformamide, 126.0 g of the resin "K", 51.9 g (0.33 mol) of 4-chloronitrobenzene and 25.0 g (0.18 mol) of potassium carbonate. 19.2 g of toluene was added to the reactor vessel. The atmosphere in the reactor vessel was replaced with nitrogen. Then, the resultant mixture was heated and the mixture was continuously stirred for 5 hours at a temperature of 140 to 150° C., to allow the mixture to react. Water generated by the reaction was sequentially removed by azeotropy with toluene. After the completion of the reaction, filtering was carried out at 80 to 90° C., to remove an inorganic salt. Then, the thus-obtained filtrate was cooled down to room temperature. The filtrate was poured to 330.3 g of methanol, to precipitate a solid. The solid was recovered by filtering, washed with methanol and then dried, to obtain 115.0 g of a bifunctional phenylene ether oligomer dinitro compound (resin "L"). The resin "L" had a number average molecular weight of 2,939 and a weight average molecular weight of 5,982. An infrared absorption spectrum (IR) of the resin "L" showed absorptions at a wavenumber of 1,518 $cm^{-1}$ and a wavenumber of 1,343 $cm^{-1}$, which correspond to an N—O bond.

(Synthesis of Bifunctional Phenylene Ether Oligomer Diamine)

Then, a 300 ml reactor vessel equipped with a stirrer was charged with 6.39 g of the resin "L", 105.3 g of N,N-dimethylformamide and 0.56 g of a 5% Pd/C catalyst. The mixture was allowed to react under a hydrogen atmosphere at room temperature for 8 hours with vigorously stirring. Then, the resultant reaction solution was filtered to remove the catalyst, then concentrated with an evaporator and then dried under reduced pressure, to obtain 5.67 g of a bifunctional phenylene ether oligomer diamine (resin "M"). The resin "M" had a number average molecular weight of 2,733, a weight average molecular weight of 6,746 and an amino group equivalent of 1,271. An infrared absorption spectrum (IR) of the resin "M" showed absorptions at a wavenumber of 3,449 $cm^{-1}$ and a wavenumber of 3,366 $cm^{-1}$, which correspond to an N—H bond.

Synthetic Example 5

Synthesis of Bifunctional Phenylene Ether Oligomer

A 2 L longitudinally long reactor equipped with a stirrer, a thermometer, an air-introducing tube and baffleplates was charged with 18.0 g (78.8 mmol) of 2,2-bis(4-hydroxyphenyl)propane(bisphenol A), 0.172 g (0.77 mmol) of $CuBr_2$, 0.199 g (1.15 mmol) of N,N'-di-t-butylethylenediamine, 2.10 g (2.07 mmol) of n-butyldimethylamine, 139 g of methanol and 279 g of toluene. Separately, 48.17 g (0.394 mol) of 2,6-dimethylphenol, 0.245 g (1.44 mmol) of N,N'-di-t-butylethylenediamine and 2.628 g (25.9 mmol) of n-butyldimethylamine were dissolved in 133 g of methanol and 266 g of toluene, to obtain a mixed solution. The mixed solution was dropwise added to the reactor, in which the mixture was stirred at a liquid temperature of 40° C., over 132 minutes while bubbling was carried with air at a flow velocity of 0.5 L/min. After the completion of the addition of the mixed solution, the resultant mixture was further stirred for 120 minutes. 400 g of water containing 2.40 g of tetrasodium ethylenediamine tetraacetate dissolved therein was added to the stirred mixture to terminate the reaction. An aqueous layer and an organic layer were separated. Then, washing with pure water was carried out. The thus-obtained solution was concentrated with an evaporator and then dried in vacuum at 120° C. for 3 hours, to obtain 54.8 g of a bifunctional phenylene ether oligomer (resin "N"). The resin "N" had a number average molecular weight of 1,348, a weight average molecular weight of 3,267 and a hydroxyl group equivalent of 503.

(Synthesis of Bifunctional Phenylene Ether Oligomer Dinitro Compound)

A 500 ml reactor vessel equipped with a stirrer, a reflux condenser, a thermometer and a Dean and Stark water separator was charged with 200.1 g of N,N-dimethylformamide, 75.5 g of the resin "N", 52.0 g (0.33 mol) of 4-chloronitrobenzene and 25.0 g (0.18 mol) of potassium carbonate. 20.0 g of toluene was added to the reactor vessel. The atmosphere in the reactor vessel was replaced with nitrogen. Then, the resultant mixture was heated and the mixture was continuously stirred for 5 hours at a temperature of 140 to 150° C., to allow the mixture to react. Water generated by the reaction was sequentially removed by azeotropy with toluene. After the completion of the reaction, filtering was carried out at 80 to 90° C., to remove an inorganic salt. Then, the thus-obtained filtrate was cooled down to room temperature. The filtrate was poured to 300.2 g of methanol, to precipitate a solid. The solid was recovered by filtering, washed with methanol and then dried, to obtain 72.1 g of a bifunctional phenylene ether oligomer dinitro compound (resin "O"). The resin "O" had a number average molecular weight of 2,103 and a weight average molecular weight of 5,194. An infrared absorption spectrum (IR) of the resin "O" showed absorptions at a wavenumber of 1,516 $cm^{-1}$ and a wavenumber of 1,340 $cm^{-1}$, which correspond to an N—O bond.

(Synthesis of Bifunctional Phenylene Ether Oligomer Diamine)

Then, a 300 ml reactor vessel equipped with a stirrer was charged with 3.93 g of the resin "O", 90.0 g of N,N-dimethylformamide and 0.49 g of a 5% Pd/C catalyst. The mixture was allowed to react under a hydrogen atmosphere at room temperature for 6 hours with vigorously stirring. Then, the resultant reaction solution was filtered to remove the catalyst, then concentrated with an evaporator and then dried under reduced pressure, to obtain 3.30 g of a bifunctional phenylene ether oligomer diamine (resin "P"). The resin "P" had a number average molecular weight of 2,051, a weight average molecular weight of 6,142 and an amino group equivalent of 954. An infrared absorption spectrum (IR) of the resin "P" showed absorptions at a wavenumber of 3,450 $cm^{-1}$ and a wavenumber of 3,365 $cm^{-1}$, which correspond to an N—H bond.

Synthetic Example 6

Synthesis of Bifunctional Phenylene Ether Oligomer

A 12 L longitudinally long reactor equipped with a stirrer, a thermometer, an air-introducing tube and baffleplates was charged with 3.88 g (17.4 mmol) of $CuBr_2$, 0.75 g (4.4 mmol) of N,N'-di-t-butylethylenediamine, 28.04 g (277.6 mmol) of n-butyldimethylamine and 2,600 g of toluene. The mixture was stirred at a reaction temperature of 40° C. Separately, 129.3 g (0.48 mol) of 2,2',3,3',5,5'-hexamethyl-(1,1'-biphenyl)-4,4'-diol, 233.7 g (1.92 mol) of 2,6-dimethylphenol, 64.9 g (0.48 mol) of 2,3,6-trimethylphenol, 0.51 g (2.9 mmol) of N,N'-di-t-butylethylenediamine and 10.90 g (108.0 mmol) of n-butyldimethylamine were dissolved in 2,300 g of methanol, to obtain a mixed solution. The mixed solution was dropwise added to the mixture in the reactor over 230 minutes with stirring while bubbling was carried out with a nitrogen-air mixed gas having an oxygen concentration of 8% at a flow velocity of 5.2 L/min. After the completion of the addition, 1,500 g of water containing 19.89 g (52.3 mmol) of tetrasodium ethylenediamine tetraacetate dissolved therein was added to the mixture to terminate the reaction. An aqueous layer and an organic layer were separated. The organic layer was washed with 1N hydrochloric acid aqueous solution and then washed with pure water. The thus-obtained solution was concentrated with an evaporator and then dried under reduced pressure at 120° C. for 3 hours, to obtain 418.1 g of a bifunctional phenylene ether oligomer (resin "Q"). The resin "Q" had a number average molecular weight of 986, a weight average molecular weight of 1,530 and a hydroxyl group equivalent of 471.

(Synthesis of Bifunctional Phenylene Ether Oligomer Dinitro Compound)

A 500 ml reactor vessel equipped with a stirrer, a reflux condenser, a thermometer and a Dean and Stark water separator was charged with 200.0 g of N,N-dimethylformamide, 70.7 g of the resin "Q", 52.0 g (0.33 mol) of 4-chloronitrobenzene and 25.1 g (0.18 mol) of potassium carbonate. 19.3 g of toluene was added to the reactor vessel. The atmosphere in the reactor vessel was replaced with nitrogen. Then, the resultant mixture was heated and the mixture was continuously stirred for 5 hours at a temperature of 140 to 150° C., to allow the mixture to react. Water generated by the reaction was sequentially removed by azeotropy with toluene. After the completion of the reaction, filtering was carried out at 80 to 90° C., to remove an inorganic salt. Then, the thus-obtained filtrate was cooled down to room temperature. The filtrate was poured to 300.3 g of methanol, to precipitate a solid. The solid was recovered by filtration, washed with methanol and then dried, to obtain 64.1 g of a bifunctional phenylene ether oligomer dinitro compound (resin "R"). The resin "R" had a number average molecular weight of 1,538 and a weight average molecular weight of 2,432. An infrared absorption spectrum (IR) of the resin "R" showed absorptions at a wavenumber of 1,522 $cm^{-1}$ and a wavenumber of 1,344 $cm^{-1}$, which correspond to an N—O bond.

(Synthesis of Bifunctional Phenylene Ether Oligomer Diamine)

Then, a 300 ml reactor vessel equipped with a stirrer was charged with 4.50 g of the resin "R", 90.9 g of N,N-dimethylformamide and 0.51 g of a 5% Pd/C catalyst. The mixture was allowed to react under a hydrogen atmosphere at room temperature for 6 hours with vigorously stirring. Then, the resultant reaction solution was filtered to remove the catalyst, then concentrated with an evaporator and then dried under reduced pressure, to obtain 3.42 g of a bifunctional phenylene ether oligomer diamine (resin "S"). The resin "S" had a number average molecular weight of 1,465, a weight average molecular weight of 2,809 and an amino group equivalent of 681. An infrared absorption spectrum (IR) of the resin "S" showed absorptions at a wavenumber of 3,447 $cm^{-1}$ and a wavenumber of 3,360 $cm^{-1}$, which correspond to an N—H bond.

Example 1

Synthesis of Polyamic Acid

A nitrogen gas was introduced into a container equipped with a stirrer, a reflux condenser and a nitrogen-introducing tube. 1.18 g of the resin "C" was charged into the container. Then, 12.6 g of N,N-dimethylacetamide was added and the resin "C" was fully dissolved therein. Then, 0.22 g of pyromellitic dianhydride was added and then the mixture was stirred at 30° C. for 3 hours, to obtain an N,N-dimethylacetamide solution of a polyamic acid "T". The reduction viscosity (N,N-dimethylacetamide solvent, 25° C., 0.5 g/dl) of the polyamic acid "T" was 1.09 dl/g. An infrared absorption (IR) spectrum of the polyamic acid "T" showed an absorption at a wavenumber of 3,300 cm$^{-1}$, which corresponds to the N—H stretching vibration of an amide group.

Example 2

Synthesis of Polyamic Acid

A nitrogen gas was introduced into a container equipped with a stirrer, a reflux condenser and a nitrogen-introducing tube. 1.18 g of the resin "C" was charged into the container. Then, 10.3 g of N,N-dimethylacetamide was added and the resin "C" was fully dissolved therein. Then, 0.29 g of 3,3',4,4'-biphenyltetracarboxylic dianhydride was added and then the mixture was stirred at 30° C. for 3 hours, to obtain an N,N-dimethylacetamide solution of a polyamic acid "U". The reduction viscosity (N,N-dimethylacetamide solvent, 25° C., 0.5 g/dl) of the polyamic acid "U" was 0.53 dl/g. An infrared absorption (IR) spectrum of the polyamic acid "U" showed an absorption at a wavenumber of 3,304 cm$^{-1}$, which corresponds to the N—H stretching vibration of an amide group.

Example 3

Synthesis of Polyamic Acid

A nitrogen gas was introduced into a container equipped with a stirrer, a reflux condenser and a nitrogen-introducing tube. 1.18 g of the resin "C" was charged into the container. Then, 22.3 g of N,N-dimethylacetamide was added and the resin "C" was fully dissolved therein. Then, 1.30 g of the resin "D" was added and then the mixture was stirred at 30° C. for 3 hours, to obtain an N,N-dimethylacetamide solution of a polyamic acid "V". The reduction viscosity (N,N-dimethylacetamide solvent, 25° C., 0.5 g/dl) of the polyamic acid "V" was 0.67 dl/g. An infrared absorption (IR) spectrum of the polyamic acid "V" showed an absorption at a wavenumber of 3,301 cm$^{-1}$, which corresponds to the N—H stretching vibration of an amide group.

Example 4

Synthesis of Polyamic Acid

A nitrogen gas was introduced into a container equipped with a stirrer, a reflux condenser and a nitrogen-introducing tube. 2.70 g of the resin "G" was charged into the container. Then, 12.6 g of N,N-dimethylacetamide was added and the resin "G" was fully dissolved therein. Then, 0.22 g of pyromellitic dianhydride was added and then the mixture was stirred at 30° C. for 3 hours, to obtain an N,N-dimethylacetamide solution of a polyamic acid "W". The reduction viscosity (N,N-dimethylacetamide solvent, 25° C., 0.5 g/dl) of the polyamic acid "W" was 0.99 dl/g. An infrared absorption (IR) spectrum of the polyamic acid "W" showed an absorption at a wavenumber of 3,305 cm$^{-1}$, which corresponds to the N—H stretching vibration of an amide group.

Example 5

Synthesis of Polyamic Acid

A nitrogen gas was introduced into a container equipped with a stirrer, a reflux condenser and a nitrogen-introducing tube. 1.12 g of the resin "J" was charged into the container. Then, 10.3 g of N,N-dimethylacetamide was added and the resin "J" was fully dissolved therein. Then, 0.22 g of pyromellitic dianhydride was added and then the mixture was stirred at 30° C. for 3 hours, to obtain an N,N-dimethylacetamide solution of a polyamic acid "X". The reduction viscosity (N,N-dimethylacetamide solvent, 25° C., 0.5 g/dl) of the polyamic acid "X" was 0.92 dl/g. An infrared absorption (IR) spectrum of the polyamic acid "X" showed an absorption at a wavenumber of 3,295 cm$^{-1}$, which corresponds to the N—H stretching vibration of an amide group.

Example 6

Synthesis of Polyamic Acid

A nitrogen gas was introduced into a container equipped with a stirrer, a reflux condenser and a nitrogen-introducing tube. 2.54 g of the resin "M" was charged into the container. Then, 10.3 g of N,N-dimethylacetamide was added and the resin "M" was fully dissolved therein. Then, 0.22 g of pyromellitic dianhydride was added and then the mixture was stirred at 30° C. for 3 hours, to obtain an N,N-dimethylacetamide solution of a polyamic acid "Y". The reduction viscosity (N,N-dimethylacetamide solvent, 25° C., 0.5 g/dl) of the polyamic acid "Y" was 0.87 dl/g. An infrared absorption (IR) spectrum of the polyamic acid "Y" showed an absorption at a wavenumber of 3,297 cm$^{-1}$, which corresponds to the N—H stretching vibration of an amide group.

Example 7

Synthesis of Polyamic Acid

A nitrogen gas was introduced into a container equipped with a stirrer, a reflux condenser and a nitrogen-introducing tube. 1.91 g of the resin, "P" was charged into the container. Then, 10.3 g of N,N-dimethylacetamide was added and the resin "P" was fully dissolved therein. Then, 0.22 g of pyromellitic dianhydride was added and then the mixture was stirred at 30° C. for 3 hours, to obtain an N,N-dimethylacetamide solution of a polyamic acid "Z". The reduction viscosity (N,N-dimethylacetamide solvent, 25° C., 0.5 g/dl) of the polyamic acid "Z" was 0.61 dl/g. An infrared absorption (IR) spectrum of the polyamic acid "Z" showed an absorption at a wavenumber of 3,301 cm$^{-1}$, which corresponds to the N—H stretching vibration of an amide group.

Example 8

Synthesis of Polyamic Acid

A nitrogen gas was introduced into a container equipped with a stirrer, a reflux condenser and a nitrogen-introducing tube. 1.36 g of the resin "S" was charged into the container. Then, 12.6 g of N,N-dimethylacetamide was added and the resin "S" was fully dissolved therein. Then, 0.22 g of pyromellitic dianhydride was added and then the mixture was stirred at 30° C. for 3 hours, to obtain an N,N-dimethylacetamide solution of a polyamic acid "AA". The reduction viscosity (N,N-dimethylacetamide solvent, 25° C., 0.5 g/dl) of the polyamic acid "AA" was 1.22 dl/g. An infrared absorption (IR) spectrum of the polyamic acid "AA" showed an absorption at a wavenumber of 3,303 cm$^{-1}$, which corresponds to the N—H stretching vibration of an amide group.

Example 9

Synthesis of Polyamic Acid

A nitrogen gas was introduced into a container equipped with a stirrer, a reflux condenser and a nitrogen-introducing tube. 0.66 g of the resin "C" and 0.12 g of 4,4'-diaminodiphenylether (ratio of formula (23):formula (24), 50:50) were charged into the container. Then, 16.45 g of N,N-dimethylacetamide was added and the resin "C" and the 4,4'-diaminodiphenylether were fully dissolved therein. Then, 0.26 g of pyromellitic dianhydride was added and then the mixture was stirred at 25° C. for 1 hour, to obtain an N,N-dimethylacetamide solution of a polyamic acid "AB". The reduction viscosity (N,N-dimethylacetamide solvent, 25° C., 0.5 g/dl) of the polyamic acid "AB" was 2.11 dl/g. An infrared absorption (IR) spectrum of the polyamic acid "AB" showed an absorption at a wavenumber of 3,300 cm$^{-1}$, which corresponds to the N—H stretching vibration of an amide group.

Comparative Example 1

A nitrogen gas was introduced into a container equipped with a stirrer, a reflux condenser and a nitrogen-introducing tube. 1.00 g of 4,4'-diaminodiphenylether was charged into the container. Then, 18.8 g of N,N-dimethylacetamide was added and the 4,4'-diaminodiphenylether was fully dissolved therein. Then, 1.09 g of pyromellitic dianhydride was added and then the mixture was stirred at 30° C. for 3 hours, to obtain an N,N-dimethylacetamide solution of a polyamic acid "AC". The reduction viscosity (N,N-dimethylacetamide solvent, 25° C., 0.5 g/dl) of the polyamic acid "AC" was 4.16 dl/g. An infrared absorption (IR) spectrum of the polyamic acid "AC" showed an absorption at a wavenumber of 3,300 cm$^{-1}$, which corresponds to the N—H stretching vibration of an amide group.

Example 10

Synthesis of Polyimide

A solution of the polyamic acid "T" was applied to a glass plate surface with a doctor blade. The applied solution was dried in air at 80° C. for 1 hour, at 150° C. for 1 hour and at 200° C. for 1 hour. Then, the dried solution was heat-treated under nitrogen at 300° C. for 1 hour, to obtain a film of a polyimide "AD" (thickness 15 µm). An infrared absorption (IR) spectrum of the polyimide "AD" showed an absorption at 1,740 cm$^{-1}$, which corresponds to the C—O stretching vibration of an imide group, and an absorption at 1,375 cm$^{-1}$, which corresponds to the C—N stretching vibration of an imide group.

Example 11

Synthesis of Polyimide

A solution of the polyamic acid "U" was applied to a glass plate surface with a doctor blade. The applied solution was dried in air at 80° C. for 1 hour, at 150° C. for 1 hour and at 200° C. for 1 hour. Then, the dried solution was heat-treated under nitrogen at 300° C. for 1 hour, to obtain a film of a polyimide "AE" (thickness 15 µm). An infrared absorption (IR) spectrum of the polyimide-"AE" showed an absorption at 1,741 cm$^{-1}$, which corresponds to the C—O stretching vibration of an imide group, and an absorption at 1,373 cm$^{-1}$, which corresponds to the C—N stretching vibration of an imide group.

Example 12

Synthesis of Polyimide

A solution of the polyamic acid "V" was applied to a glass plate surface with a doctor blade. The applied solution was dried in air at 80° C. for 1 hour, at 150° C. for 1 hour and at 200° C. for 1 hour. Then, the dried solution was heat-treated under nitrogen at 250° C. for 2 hours, to obtain a film of a polyimide "AF" (thickness 15 µm). An infrared absorption (IR) spectrum of the polyimide "AF" showed an absorption at 1,739 cm$^{-1}$, which corresponds to the C—O stretching vibration of an imide group, and an absorption at 1,371 cm$^{-1}$, which corresponds to the C—N stretching vibration of an imide group.

Example 13

Synthesis of Polyimide

A solution of the polyamic acid "W" was applied to a glass plate surface with a doctor blade. The applied solution was dried in air at 80° C. for 1 hour, at 150° C. for 1 hour and at 200° C. for 1 hour. Then, the dried solution was heat-treated under nitrogen at 300° C. for 1 hour, to obtain a film of a polyimide "AG" (thickness 15 µm). An infrared absorption (IR) spectrum of the polyimide "AG" showed an absorption at 1,738 cm$^{-1}$, which corresponds to the C—O stretching vibration of an imide group, and an absorption at 1,373 cm$^{-1}$, which corresponds to the C—N stretching vibration of an imide group.

Example 14

Synthesis of Polyimide

A solution of the polyamic acid "X" was applied to a glass plate surface with a doctor blade. The applied solution was dried in air at 80° C. for 1 hour, at 150° C. for 1 hour and at 200° C. for 1 hour. Then, the dried solution was heat-treated under nitrogen at 300° C. for 1 hour, to obtain a film of a polyimide "AH" (thickness 15 µm). An infrared absorption (IR) spectrum of the polyimide "AH" showed an absorption at 1,743 cm$^{-1}$, which corresponds to the C—O stretching vibration of an imide group, and an absorption at 1,375 cm$^{-1}$, which corresponds to the C—N stretching vibration of an imide group.

Example 15

Synthesis of Polyimide

A solution of the polyamic acid "Y" was applied to a glass plate surface with a doctor blade. The applied solution was dried in air at 80° C. for 1 hour, at 150° C. for 1 hour and at 200° C. for 1 hour. Then, the dried solution was heat-treated under nitrogen at 300° C. for 1 hour, to obtain a film of a polyimide "AI" (thickness 15 µm). An infrared absorption (IR) spectrum of the polyimide "AI" showed an absorption at 1,741 cm$^{-1}$, which corresponds to the C—O stretching vibration of an imide group, and an absorption at 1,376 cm$^{-1}$, which corresponds to the C—N stretching vibration of an imide group.

Example 16

Synthesis of Polyimide

A solution of the polyamic acid "Z" was applied to a glass plate surface with a doctor blade. The applied solution was dried in air at 80° C. for 1 hour, at 150° C. for 1 hour and at 200° C. for 1 hour. Then, the dried solution was heat-treated under nitrogen at 300° C. for 1 hour, to obtain a film of a polyimide "AJ" (thickness 15 μm). An infrared absorption (IR) spectrum of the polyimide "AJ" showed an absorption at 1,738 cm$^{-1}$, which corresponds to the C—O stretching vibration of an imide group, and an absorption at 1,377 cm$^{-1}$, which corresponds to the C—N stretching vibration of an imide group.

Example 17

Synthesis of Polyimide

A solution of the polyamic acid "AA" was applied to a glass plate surface with a doctor blade. The applied solution was dried in air at 80° C. for 1 hour, at 150° C. for 1 hour and at 200° C. for 1 hour. Then, the dried solution was heat-treated under nitrogen at 300° C. for 1 hour, to obtain a film of a polyimide "AK" (thickness 15 μm). An infrared absorption (IR) spectrum of the polyimide "AK" showed an absorption at 1,742 cm$^{-1}$, which corresponds to the C—O stretching vibration of an imide group, and an absorption at 1,378 cm$^{-1}$, which corresponds to the C—N stretching vibration of an imide group.

Example 18

Synthesis of Polyimide

A solution of the polyamic acid "AB" was applied to a shiny surface of an electrolytic copper foil (supplied by Mitsui Mining & Smelting Co., Ltd., 3EC-III, 18 μmt) with a doctor blade. The applied solution was dried in air at 80° C. for 1 hour, at 150° C. for 1 hour and at 200° C. for 1 hour. Then, the dried solution was heat-treated under nitrogen at 300° C. for 1 hour, to obtain a laminate having a metal layer on one surface thereof. The copper foil was removed by etching, to obtain a film of an polyimide "AL" (thickness 15 μm). An infrared absorption (IR) spectrum of the polyimide "AL" showed an absorption at 1,740 cm$^{-1}$, which corresponds to the C—O stretching vibration of an imide group, and an absorption at 1,375 cm$^{-1}$, which corresponds to the C—N stretching vibration of an imide group.

Comparative Example 2

Synthesis of Polyimide

A solution of the polyamic acid "AC" was applied to a glass plate surface with a doctor blade. The applied solution was dried in air at 80° C. for 1 hour, at 150° C. for 1 hour and at 200° C. for 1 hour. Then, the dried solution was heat-treated under nitrogen at 300° C. for 1 hour, to obtain a film of a polyimide "AM" (thickness 15 μm). An infrared absorption (IR) spectrum of the polyimide "AM" showed an absorption at 1,735 cm$^{-1}$, which corresponds to the C—O stretching vibration of an imide group, and an absorption at 1,374 cm$^{-1}$, which corresponds to the C—N stretching vibration of an imide group.

The polyimide films obtained in Examples 10 to 18 and Comparative Example 2 were measured for dielectric characteristics at a dried time and at a moisture-absorbed time. Table 1 shows the results thereof.

TABLE 1

| | | | EX. 10 | EX. 11 | EX. 12 | EX. 13 | EX. 14 |
|---|---|---|---|---|---|---|---|
| Diamine | | | Resin C | Resin C | Resin C | Resin G | Resin J |
| Acid dianhydride | | | PMDA | BPDA | Resin D | PMDA | PMDA |
| Polyamic acid | | | Resin T | Resin U | Resin V | Resin W | Resin X |
| Polyimide | | | Resin AD | Resin AE | Resin AF | Resin AG | Resin AH |
| At a dried time | Dielectric constant | 10 GHz | 2.62 | 2.59 | 2.50 | 2.58 | 2.61 |
| | Dielectric loss tangent | 10 GHz | 0.003 | 0.003 | 0.003 | 0.003 | 0.003 |
| At a moisture-absorbed time | Dielectric constant | 10 GHz | 2.69 | 2.66 | 2.54 | 2.66 | 2.70 |
| | Dielectric loss tangent | 10 GHz | 0.009 | 0.008 | 0.006 | 0.008 | 0.009 |

| | | | EX. 15 | EX. 16 | EX. 17 | EX. 18 | CEX. 2 |
|---|---|---|---|---|---|---|---|
| Diamine | | | Resin M | Resin P | Resin S | Resin C/ODA | ODA |
| Acid dianhydride | | | PMDA | PMDA | PMDA | PMDA | PMDA |
| Polyamic acid | | | Resin Y | Resin Z | Resin AA | Resin AB | Resin AC |
| Polyimide | | | Resin AI | Resin AJ | Resin AK | Resin AL | Resin AM |
| At a dried time | Dielectric constant | 10 GHz | 2.59 | 2.68 | 2.61 | 2.64 | 3.01 |
| | Dielectric loss tangent | 10 GHz | 0.003 | 0.003 | 0.003 | 0.004 | 0.004 |
| At a moisture-absorbed time | Dielectric constant | 10 GHz | 2.68 | 2.80 | 2.68 | 2.72 | 3.51 |
| | Dielectric loss tangent | 10 GHz | 0.008 | 0.009 | 0.009 | 0.012 | 0.037 |

EX. = Example,
CEx. = Comparative Example.

ODA: 4,4'-diaminodiphenyl ether
PMDA: pyromellitic dianhydride
BPDA: 3,3',4,4'-biphenyltetracarboxylic dianhydride From Examples 10-18 and Comparative Example 2, it is found that the polyimides of the present invention have remarkably low dielectric constants and can maintain low dielectric characteristics even at a moisture-absorbed time.

Example 19

Synthesis of Polyimide

A solution of the polyamic acid "T" was applied to a mat surface of an electrolytic copper foil (supplied by Mitsui Mining & Smelting Co., Ltd., 3EC-III, 18 μmt) with a doctor blade. The applied solution was dried in air at 80° C. for 1 hour, at 150° C. for 1 hour and at 200° C. for 1 hour. Then, the dried solution was heat-treated under nitrogen at 300° C. for 1 hour, to obtain a laminate having a metal layer on one surface thereof. The thickness of a polyimide layer thereof was 15 μm. The laminate was measured for a copper-foil peel strength on the basis of JIS C-6481. The copper-foil peel strength was 1.3 kN/m.

What is claimed is:

1. A polyimide having a structural unit represented by formula (1),

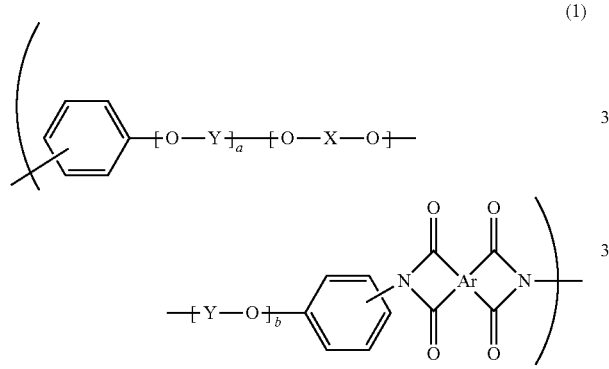

(1)

wherein:
—(O—X—O)— is a structure of formula (2), shown below, or formula (3), shown below,
—(Y—O)— is an arrangement of one kind of structure of formula (4), shown below, or a random arrangement of at least two kinds of structures of the formula (4),
each of a and b is an integer of 0 to 100, provided that at least one of a and b is not 0, and
Ar represents a tetravalent aromatic group selected from the group consisting of a monocyclic aromatic group, a condensed polycyclic aromatic group and a non-condensed polycyclic aromatic group having a structure in which monocyclic aromatic groups are connected to each other directly or through a connecting group,

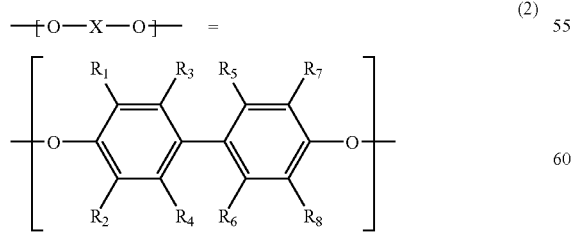

(2)

wherein:
$R_1$, $R_2$, $R_3$, $R_7$ and $R_8$ are the same or different and represent an alkyl group having 6 or less carbon atoms or a phenyl group, and $R_4$, $R_5$ and $R_6$ are the same or different and represent a hydrogen atom, an alkyl group having 6 or less carbon atoms or a phenyl group,

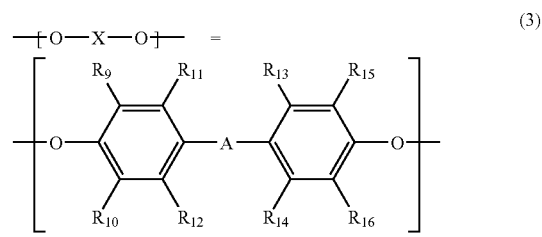

(3)

wherein:
$R_9$, $R_{10}$, $R_{11}$, $R_{12}$, $R_{13}$, $R_{14}$, $R_{15}$ and $R_{16}$ are the same or different and represent a hydrogen atom, an alkyl group having 6 or less carbon atoms or a phenyl group, and
-A- represents a linear, branched or cyclic bivalent hydrocarbon group having 20 or less carbon atoms,

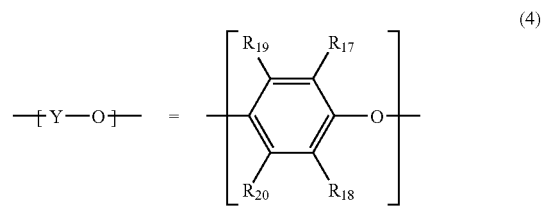

(4)

wherein:
$R_{17}$ and $R_{18}$ are the same or different and represent an alkyl group having 6 or less carbon atoms or a phenyl group, and
$R_{19}$ and $R_{20}$ are the same or different and represent a hydrogen atom, an alkyl group having 6 or less carbon atoms or a phenyl group,
wherein the polyimide has (i) a dielectric constant measured at 10 GHz at a moisture adsorbed time of less than or equal to 2.80, and (ii) a dielectric loss tangent measured at 10 GHz at a moisture adsorbed time of less than or equal to 0.012.

2. The polyimide according to claim 1, wherein the polyimide further contains a structural unit of formula (5), below, in a formula (1):formula (5) ratio of 100:0-50:50,

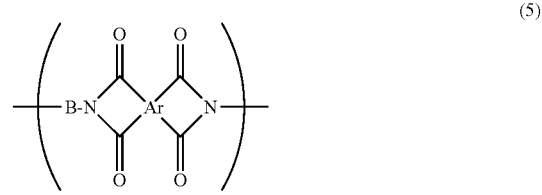

(5)

wherein:
Ar represents a tetravalent aromatic group selected from the group consisting of a monocyclic aromatic group, a condensed polycyclic aromatic group and a non-condensed polycyclic aromatic group having a structure in which monocyclic aromatic groups are connected to each other directly or through a connecting group, and B represents a bivalent aromatic group having 6 to 30 carbon atoms selected from the group consisting of a monocyclic aromatic group, a condensed polycyclic aromatic group and a non-condensed polycyclic aromatic group having a structure in which monocyclic aromatic groups are connected to each other directly or through a connecting group.

3. The polyimide according to claim 1, wherein:
—(O—X—O)— in the formula (1) is a structure of formula (6), below, formula (7), below, or formula (8), below, and
—(Y—O)— in the formula (1) is an arrangement of a structure of formula (9), below, or formula (10), below, or a random arrangement of a structure of the formula (9) and a structure of the formula (10),

(6)
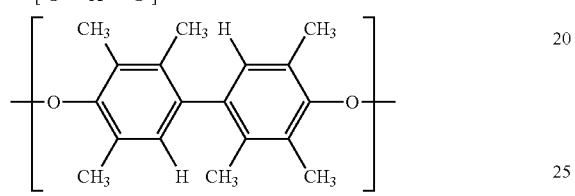

(7)
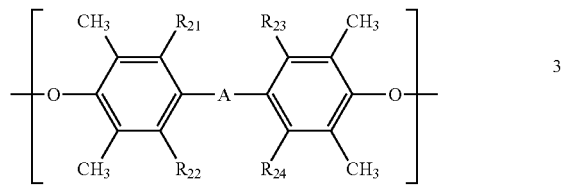

wherein:
$R_{21}$, $R_{22}$, $R_{23}$ and $R_{24}$ are the same or different and represent a hydrogen atom or a methyl group, and -A- represents a linear, branched or cyclic bivalent hydrocarbon group having 20 or less carbon atoms,

(8)
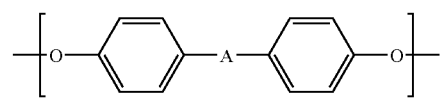

wherein:
-A- represents a linear, branched or cyclic bivalent hydrocarbon group having 20 or less carbon atoms,

(9)
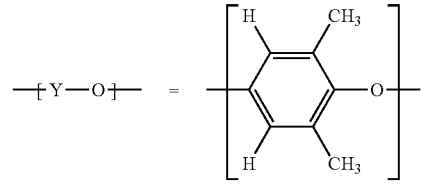

(10)
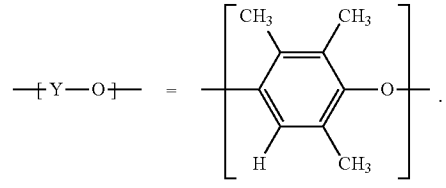

4. The polyimide according to claim 1, wherein:
Ar in the formula (1) is an aromatic group having 6 or less carbon atoms or an aromatic group represented by formula (11),

(11)
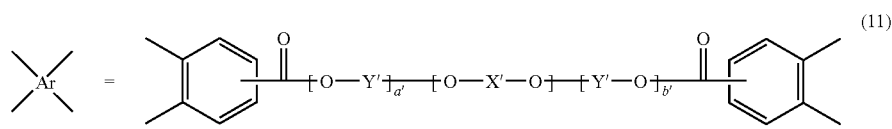

wherein:
—(O—X'—O)— is a structure of formula (12), below, or formula (13), below,
—(Y'—O)— is an arrangement of one kind of structure of formula (14), below, or a random arrangement of at least two kinds of structures of the formula (14), and
each of a' and b' is an integer of 0 to 100, provided that at least one of a' and b' is not 0,

(12)
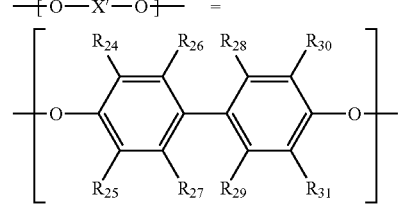

wherein:

$R_{24}$, $R_{25}$, $R_{26}$, $R_{30}$ and $R_{31}$ are the same or different and represent an alkyl group having 6 or less carbon atoms or a phenyl group, and $R_{27}$, $R_{28}$ and $R_{29}$ are the same or different and represent a hydrogen atom, an alkyl group having 6 or less carbon atoms or a phenyl group,

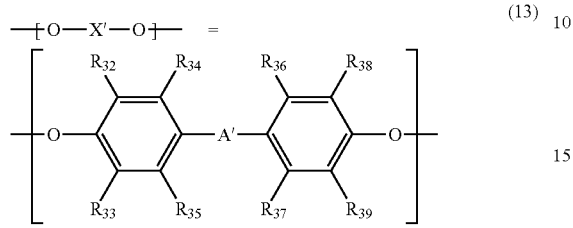

(13)

wherein:

$R_{32}$, $R_{33}$, $R_{34}$, $R_{35}$, $R_{36}$, $R_{37}$, $R_{38}$ and $R_{39}$ are the same or different and represent a hydrogen atom, an alkyl group having 6 or less carbon atoms or a phenyl group, and -A'- represents a linear, branched or cyclic bivalent hydrocarbon group having 20 or less carbon atoms,

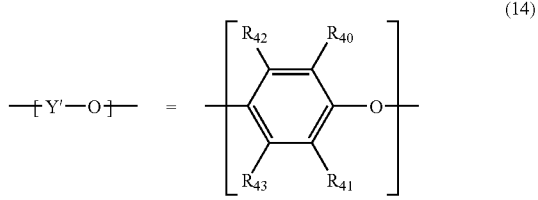

(14)

wherein:

$R_{40}$ and $R_{41}$ are the same or different and represent an alkyl group having 6 or less carbon atoms or a phenyl group, and $R_{42}$ and $R_{43}$ are the same or different and represent a hydrogen atom, an alkyl group having 6 or less carbon atoms or a phenyl group.

5. The polyimide according to claim 1, wherein the structural unit of the formula (1) is a structural unit of formula (15),

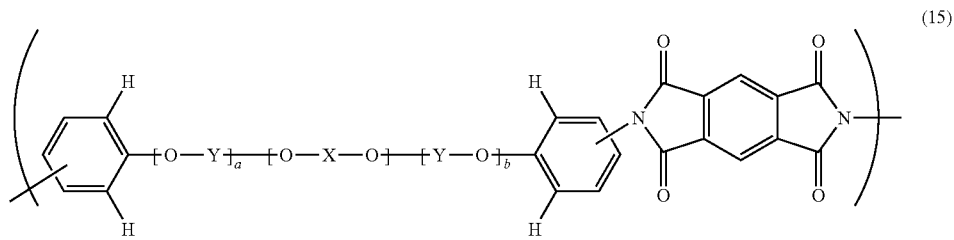

(15)

wherein —(O—X—O)—, —(Y—O)—, a and b are as defined according to formula (1) in claim 1.

6. The polyimide according to claim 1, wherein the structural unit of the formula (1) is a structural unit of formula (16),

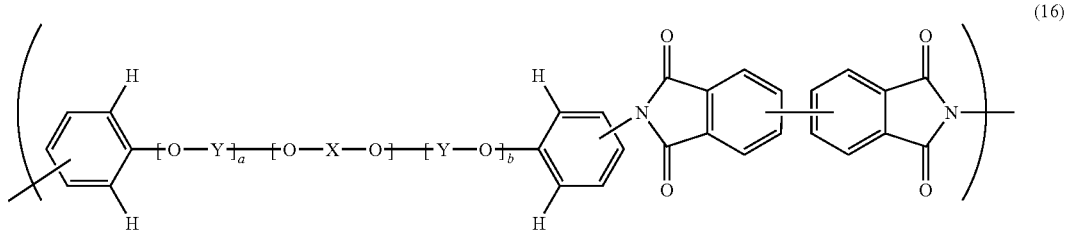

(16)

wherein —(O—X—O)—, —(Y—O)—, a and b are as defined according to formula (1) in claim 1.

7. The polyimide according to claim 1, wherein the structural unit of the formula (1) is a structural unit of formula (17),

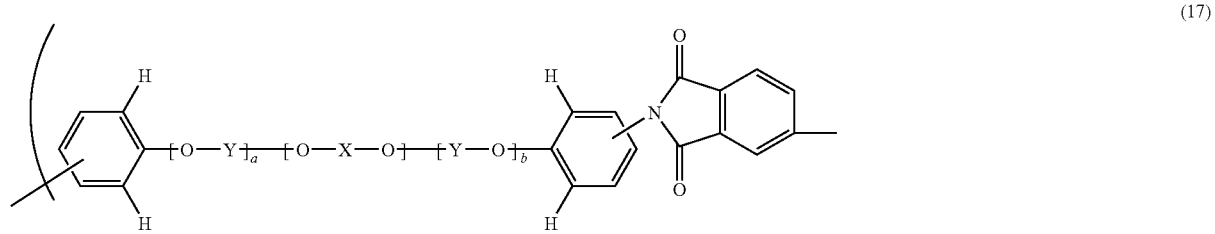

(17)

-continued

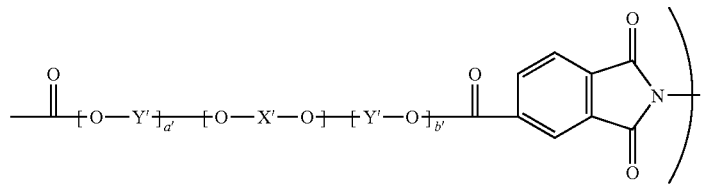

wherein:

—(O—X—O)—, —(Y—O)—, a and b are as defined according to formula (1) in claim 1, and —(O—X'—O)— is a structure of formula (12), below, or formula (13), below, —(Y'—O)— is an arrangement of one kind of structure of formula (14), below, or a random arrangement of at least two kinds of structures of the formula (14), and each of a' and b' is an integer of 0 to 100, provided that at least one of a' and b' is not 0,

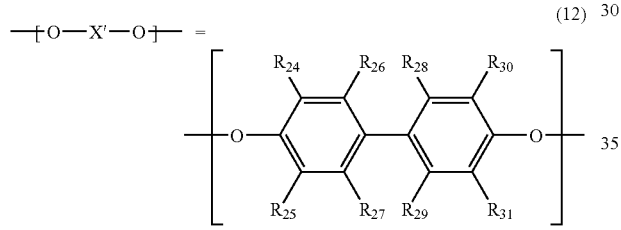

wherein:

$R_{24}$, $R_{25}$, $R_{26}$, $R_{30}$ and $R_{31}$ are the same or different and represent an alkyl group having 6 or less carbon atoms or a phenyl group, and $R_{27}$, $R_{28}$ and $R_{29}$ are the same or different and represent a hydrogen atom, an alkyl group having 6 or less carbon atoms or a phenyl group,

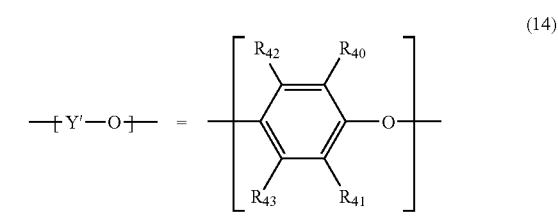

wherein:

$R_{32}$, $R_{33}$, $R_{34}$, $R_{35}$, $R_{36}$, $R_{37}$, $R_{38}$ and $R_{39}$ are the same or different and represent a hydrogen atom, an alkyl group having 6 or less carbon atoms or a phenyl group, and -A'- represents a linear, branched or cyclic bivalent hydrocarbon group having 20 or less carbon atoms, wherein:

$R_{40}$ and $R_{41}$ are the same or different and represent an alkyl group having 6 or less carbon atoms or a phenyl group, and $R_{42}$ and $R_{43}$ are the same or different and represent a hydrogen atom, an alkyl group having 6 or less carbon atoms or a phenyl group.

8. A process for the production of the polyimide as defined in claim 1, said process comprising:
cyclodehydrating a polyamic acid having a structural unit of formula (18),

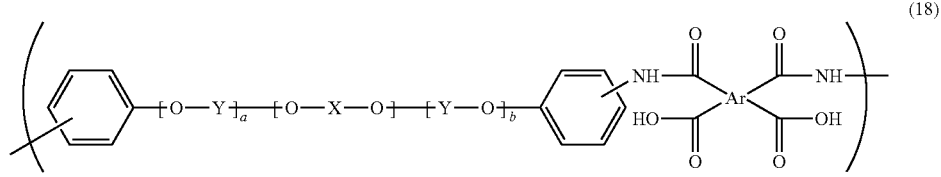

wherein:
—(O—X—O)— is a structure of formula (2), below, or formula (3), below,
—(Y—O)— is an arrangement of one kind of structure of formula (4), below, or a random arrangement of at least two kinds of structures of the formula (4), each of a and b is an integer of 0 to 100, provided that at least one of a and b is not 0, and Ar represents a tetravalent aromatic group selected from the group consisting of a monocyclic aromatic group, a condensed polycyclic aromatic group and a non-condensed polycyclic aromatic group having a structure in which monocyclic aromatic groups are connected to each other directly or through a connecting group,

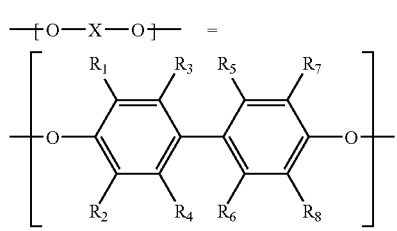
(2)

wherein:

$R_1$, $R_2$, $R_3$, $R_7$ and $R_8$ are the same or different and represent an alkyl group having 6 or less carbon atoms or a phenyl group, and $R_4$, $R_5$ and $R_6$ are the same or different and represent a hydrogen atom, an alkyl group having 6 or less carbon atoms or a phenyl group,

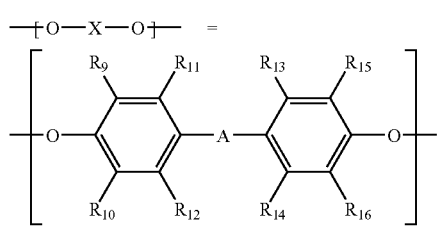
(3)

wherein:

$R_9$, $R_{10}$, $R_{11}$, $R_{12}$, $R_{13}$, $R_{14}$, $R_{15}$ and $R_{16}$ are the same or different and represent a hydrogen atom, an alkyl group having 6 or less carbon atoms or a phenyl group, and -A- represents a linear, branched or cyclic bivalent hydrocarbon group having 20 or less carbon atoms,

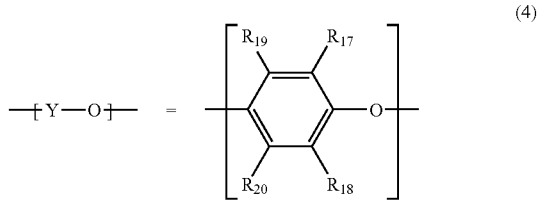
(4)

wherein:

$R_{17}$ and $R_{18}$ are the same or different and represent an alkyl group having 6 or less carbon atoms or a phenyl group, and $R_{19}$ and $R_{20}$ are the same or different and represent a hydrogen atom, an alkyl group having 6 or less carbon atoms or a phenyl group.

9. A process for the production of the polyimide as defined in claim 2, said process comprising:

cyclodehydrating a polyamic acid which contains a structural unit of formula (18), below, and a structural unit of formula (19), below, in a formula (18):formula (19) ratio of 100:0-50:50,

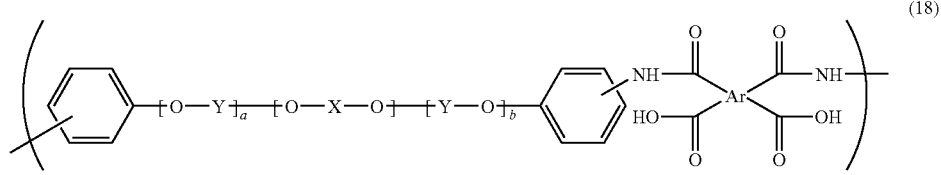
(18)

wherein:
—(O—X—O)— is a structure of formula (2), below, or formula (3), below,
—(Y—O)— is an arrangement of one kind of structure of formula (4), below, or a random arrangement of at least two kinds of structures of the formula (4),
each of a and b is an integer of 0 to 100, provided that at least one of a and b is not 0, and
Ar represents a tetravalent aromatic group selected from the group consisting of a monocyclic aromatic group, a condensed polycyclic aromatic group and a non-condensed polycyclic aromatic group having a structure in which monocyclic aromatic groups are connected to each other directly or through a connecting group,

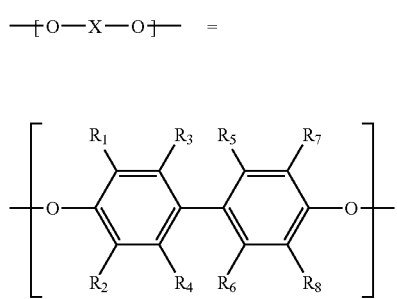
(2)

wherein:

$R_1$, $R_2$, $R_3$, $R_7$ and $R_8$ are the same or different and represent an alkyl group having 6 or less carbon atoms or a phenyl group, and $R_4$, $R_5$ and $R_6$ are the same or different and represent a hydrogen atom, an alkyl group having 6 or less carbon atoms or a phenyl group,

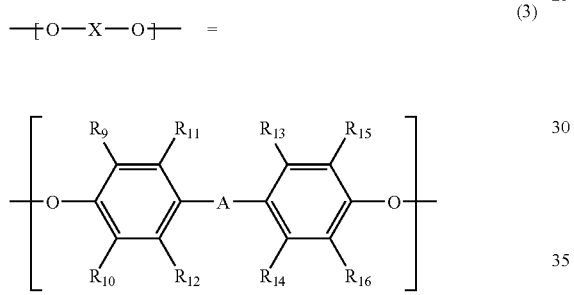
(3)

wherein:

$R_9$, $R_{10}$, $R_{11}$, $R_{12}$, $R_{13}$, $R_{14}$, $R_{15}$ and $R_{16}$ are the same or different and represent a hydrogen atom, an alkyl group having 6 or less carbon atoms or a phenyl group, and -A- represents a linear, branched or cyclic bivalent hydrocarbon group having 20 or less carbon atoms,

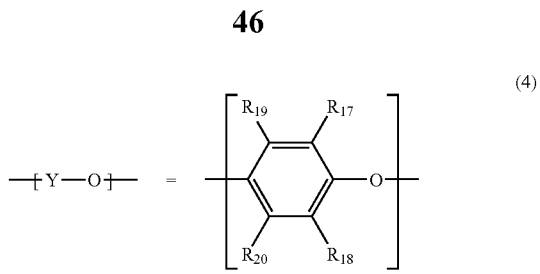
(4)

wherein:

$R_{17}$ and $R_{18}$ are the same or different and represent an alkyl group having 6 or less carbon atoms or a phenyl group, and $R_{19}$ and $R_{20}$ are the same or different and represent a hydrogen atom, an alkyl group having 6 or less carbon atoms or a phenyl group,

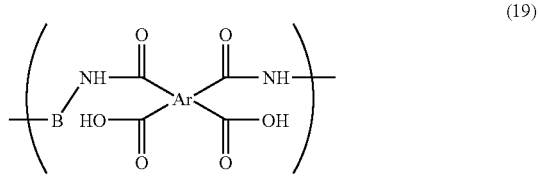
(19)

wherein:

Ar represents a tetravalent aromatic group selected from the group consisting of a monocyclic aromatic group, a condensed polycyclic aromatic group and a non-condensed polycyclic aromatic group having a structure in which monocyclic aromatic groups are connected to each other directly or through a connecting group, and B represents a bivalent aromatic group having 6 to 30 carbon atoms selected from the group consisting of a monocyclic aromatic group, a condensed polycyclic aromatic group and a non-condensed polycyclic aromatic group having a structure in which monocyclic aromatic groups are connected to each other directly or through a connecting group.

10. A film made of the polyimide as defined in claim 1.

11. A laminate comprising the film as defined in claim 10 and a metal layer on one side or both sides of the film.

* * * * *